(12) United States Patent
Wibben

(10) Patent No.: US 9,425,785 B1
(45) Date of Patent: Aug. 23, 2016

(54) SWITCHING REGULATOR WITH CONTROLLABLE SLEW RATE

(71) Applicant: Allegro Microsystems, LLC, Worcester, MA (US)

(72) Inventor: Joshua Wibben, New Brighton, MN (US)

(73) Assignee: Allegro Microsystems, LLC, Worcester, MA (US)

( * ) Notice: Subject to any disclaimer, the term of this patent is extended or adjusted under 35 U.S.C. 154(b) by 0 days.

(21) Appl. No.: 14/798,912

(22) Filed: Jul. 14, 2015

(51) Int. Cl.
| H03B 1/00 | (2006.01) |
| H03K 3/00 | (2006.01) |
| H03K 17/16 | (2006.01) |
| H03K 5/05 | (2006.01) |

(52) U.S. Cl.
CPC ............... *H03K 17/165* (2013.01); *H03K 5/05* (2013.01)

(58) Field of Classification Search
CPC ...................................... H03K 17/165–17/167
USPC .................................................. 327/109–112
See application file for complete search history.

(56) References Cited

U.S. PATENT DOCUMENTS

| 4,540,893 | A | 9/1985 | Bloomer |
| 5,594,369 | A | 1/1997 | Kondoh et al. |
| 5,668,449 | A | 9/1997 | Carobolante |
| 5,670,894 | A | 9/1997 | Takaishi et al. |
| 6,208,177 | B1 | 3/2001 | Knoedl, Jr. |
| 6,396,250 | B1 | 5/2002 | Bridge |
| 6,411,120 | B1 | 6/2002 | Hung et al. |
| 6,448,807 | B1 | 9/2002 | Ahsanullah |
| 6,650,153 | B2 | 11/2003 | Zerilli et al. |
| 6,664,822 | B2* | 12/2003 | Watabe ................. H02M 7/538 327/108 |
| 7,737,666 | B2* | 6/2010 | Sutardja ............... H02M 3/1588 323/222 |
| 7,839,185 | B2* | 11/2010 | Schwarzer ........ H03K 17/0828 326/82 |
| 7,936,189 | B2 | 5/2011 | Tumminaro et al. |
| 8,692,482 | B2 | 4/2014 | Szczeszynski et al. |
| 8,773,172 | B2 | 7/2014 | Bayerer |
| 8,779,805 | B1 | 7/2014 | Fernandez et al. |
| 8,957,715 | B2 | 2/2015 | Eagen |
| 2002/0153928 | A1 | 10/2002 | Zerilli et al. |
| 2006/0267861 | A1 | 11/2006 | Yonezawa |
| 2010/0156505 | A1 | 6/2010 | Strzalkowski |
| 2014/0253186 | A1 | 9/2014 | De Geeter et al. |

FOREIGN PATENT DOCUMENTS

| DE | 10 2007 009 734 | 6/2008 |
| JP | 2003125574 | 4/2003 |

OTHER PUBLICATIONS

Notice of Allowance dated Mar. 8, 2016 for U.S. Appl. No. 14/677,029, 14 pages.

(Continued)

*Primary Examiner* — Lincoln Donovan
*Assistant Examiner* — Metasebia Retebo
(74) *Attorney, Agent, or Firm* — Daly, Crowley, Mofford & Durkee, LLP

(57) ABSTRACT

A driver circuit for driving a switching transistor having a control terminal responsive to a switching control signal includes a plurality of driver stages, each having a control input responsive to a respective driver control signal and an output coupled to the output of the other driver stages and to the control terminal of the switching transistor. At least one of the driver control signals has an on time that is delayed with respect to the other driver control signals. In an embodiment, at least two driver stages are on during a slew time interval.

21 Claims, 16 Drawing Sheets

(56) References Cited

OTHER PUBLICATIONS

U.S. Appl. No. 14/554,396, filed Nov. 26, 2014, McIntosh et al.
U.S. Appl. No. 14/620,656, filed Feb. 12, 2015, Wibben et al.
U.S. Appl. No. 14/677,029, filed Apr. 2, 2015, Martin et al.
U.S. Appl. No. 62/037,838, filed Aug. 15, 2014, Martin et al.
Advanced Power Technology Application Note APT0102; "Optimizing MOSFET and IGBT Gate Current to Minimize dv/dt Induced Failures in SMPS Circuits", Oct. 29, 2001, 6 pages.
Allegro Microsystems, LLC Data Sheet A4911; "Automotive Three Phase MOSFET Driver;" May 22, 2015; pp. 1-60.
Allegro Microsystems, LLC Data Sheet A4933; "Automotive 3-Phase MOSFET Driver;" Jan. 2010; 25 pages.
Allegro Microsystems, LLC Data Sheet A8660; "Synchronous Buck Controller with Low Operating Current;" May 20, 2015; 30 pages.
STMicroelectronics Data Sheet L99DZ80EP; "Door Actuator Driver;" Sep. 2013; 68 pages.
Article 19 Amendment filed Jun. 13, 2014 for PCT Application No. PCT/US2013/071165; 10 pages.
Notice of Allowance dated Jan. 15, 2016 for U.S. Appl. No. 14/554,396; 10 pages
Search Report and Written Opinion dated Jan. 28, 2016 for PCT Application No. PCT/US2015/057920; 10 pages.

\* cited by examiner

SWITCHING REGULATOR WITH CONTROLLABLE SLEW RATE

CROSS REFERENCE TO RELATED APPLICATIONS

Not Applicable.

STATEMENT REGARDING FEDERALLY SPONSORED RESEARCH

Not Applicable.

FIELD

This disclosure relates generally to switching regulators and, more particularly, to switching regulator driver circuitry and techniques for slew rate control.

BACKGROUND

Regulators, or converters, including one or more switches, sometimes referred to as power switch(es), for transferring energy from an input, such as an AC or DC voltage or current source, to a regulated output are well known. In some regulators, sometimes referred to as switching regulators, the switch turns on and off to regulate the output. In other regulators, sometimes referred to as linear regulators, the switch operates in its active, or saturation region.

Common switching regulator configurations include Buck, Boost, Buck-Boost, flyback, SEPIC, Cúk, half bridge, and full bridge to name a few. As is also well known, various control methodologies for controlling conduction of the power switch(es) can be applied to switching regulators, including Pulse Width Modulation (PWM) and Pulse Frequency Modulation (PFM), and for each of these control methodologies, various feedback and feed forward techniques are possible including voltage mode control and current mode control. Switching regulators are often used to provide a regulated current and/or voltage to drive a load.

Conventional Buck regulators generally contain a switch that conducts to transfer energy to an inductor during a first portion of each cycle and a diode (sometimes referred to as a freewheeling diode) that conducts during a second portion of each cycle to cause energy to be transferred from the inductor to the load. A variation of this conventional Buck regulator is referred to as a synchronous Buck regulator in which the freewheeling diode is replaced with a second switch. Although this configuration requires additional control circuitry to drive both of the switches, use of the second switch can result in improved efficiency.

An example synchronous Buck regulator 10 is shown in FIG. 1 to include switches 12, 14, here in the form of n-channel metal oxide semiconductor field effect transistors (MOSFETs or simply FETs), coupled between an input voltage source VIN 13 and a reference such as ground 15. A node SW 11 between the high side switch 12 and the low side switch 14 is coupled to an inductor 16 which stores energy for transfer to a load (not shown) coupled to an output terminal 18 at which a regulated output voltage VOUT is provided. An output capacitor 20 is also coupled to the output terminal 18.

Conduction of switching transistors 12, 14 is controlled by control circuit 48 and driver circuit 50. In the illustrated regulator 10, the control circuit 48 includes an error amplifier 26 that is responsive to the VOUT voltage 18 and to a reference signal 24 to generate a COMP signal 66 across a series-coupled resistor 28 and capacitor 30. The COMP signal 66 is coupled to an input of a comparator 32 that further receives a ramp signal from a summation element 36. More particularly, the summation element 36 sums a first ramp signal 64 with a feedback signal 40 that is proportional to the current through the switches 12, 14. An output of the comparator 32 provides a reset input to a flip-flop 34 that is set by a clock signal 58 from an oscillator 38. The output of the flip-flop 34 provides a feedback control signal HSON 52 that establishes on and off times of the high side switch 12 through the driver circuit 50, here in the form of a buffer 46, based on the output voltage VOUT 18. The HSON signal 52 is additionally coupled to a delay element 45 and a buffer 44 to establish on and off times for the low side switch 14, as shown.

In some embodiments, the control circuit 48 and driver circuit 50 can be provided in an integrated circuit (IC) package and the remainder of the regulator circuitry 51 can be external to the IC package. In this type of arrangement, the IC may be referred to generally as a driver IC.

It is desirable to operate switching regulators in a manner that enhances the electromagnetic compatibility (EMC) performance of the regulator. For example, in applications where a driver IC is used to drive one or more external transistors, it is generally desirable that the switching activity of the external transistor(s) cause as little electromagnetic interference (EMI) as possible to surrounding circuitry. It is known that fast slew rate (i.e., the rate of change of the switch drain to source, Vds, voltage per unit time) can contribute to EMI/EMC problems. However, it is also desirable that transitions between switching states be performed quickly with as little switching delay as possible since a slow slew rate and/or significant dead time (i.e., time when neither transistor is on, such as the time between the low side switch turning off and the high side switch turning on) can negatively impact regulator efficiency. It can be challenging to establish a switch slew rate and/or dead time that strikes an optimal balance between these competing requirements.

Slew rate is a function of various factors, such as the switch gate impedance, the switch capacitance, and the load current. In applications in which the switch capacitance and load current are well defined to within a relatively narrow range, the slew rate can be "tuned" by using external resistors, such as resistors 70, 72 in FIG. 1, in series with the respective gate connection to establish well controlled gate impedance. In general, in order to achieve substantially the same slew rate, smaller gate impedance is necessary for larger FETs (i.e., FETs with larger switch capacitance that drive larger loads) and larger gate impedance is necessary for smaller FETs (i.e., FETs with smaller switch capacitance that drive smaller loads). However, the difficulty of implementing such switch slew rate optimization can be compounded by use of a driver IC to drive a variety of external switches for a variety of loads, since the switch capacitance and load current can vary.

It is also desirable to operate switching regulators in a manner that optimizes the dead time. If the dead time is too long, the body diode of the low side switch 14 will conduct, which decreases the regulator efficiency due to switching and conduction losses of the diode and the reverse recovery time associated with turning off the diode. On the other hand, a dead time that is too short can result in both the high side switch 12 and the low side switch 14 being on at the same time, which can cause undesirable shoot through currents that can adversely impact EMI performance and efficiency.

Dead time is affected by various parameters of the driven switches 12, 14, such as the threshold voltages, gate capacitance, and gate resistance. Thus, optimization of the dead time is challenging when such parameters are not well known or tightly controlled, such as when using a driver IC to drive a range of external FET switches 12, 14. Furthermore, this optimization can be even more challenging since these FET parameters are influenced by other factors, such as load current, input voltage, output voltage, and temperature variations.

SUMMARY

A driver circuit for driving a switching transistor having a control terminal responsive to a switching control signal includes a plurality of driver stages, each having a control input responsive to a respective driver control signal having an on time during which the driver stage is on and an off time during which the driver stage is off and having an output coupled to the output of the other ones of the plurality of driver stages and to the control terminal of the switching transistor. At least one of the plurality of driver control signals has an on time that is delayed with respect to an on time of another one of the plurality of driver control signals. With this arrangement, the driver stages are sequentially turned on to establish a controlled slew rate. As more driver stages are turned on, the total impedance of the parallel-coupled driver stages decreases in order to thereby allow the gate of the switch to charge more quickly than otherwise possible. With the described circuitry and techniques, switch slew rate optimization for a variety of external switches and loads can be achieved.

Features may include one or more of the following. At least two of the driver stages are on during a slew time interval that commences when a Miller plateau of the switching transistor is reached and terminates when a source to drain voltage of the switching transistor reaches a final voltage level. Each of the plurality of driver stages may include a driver transistor having a gate terminal providing the control input, a source terminal, and a drain terminal, with the source terminals of the driver transistors coupled together and the drain terminals of the driver transistors coupled together and to the control terminal of the switching transistor.

The driver circuit may include a driver control signal generator configured to generate the plurality of driver control signals and including at least one delay element. The driver control signal generator may be responsive to a slew time interval indication signal to cause each of the plurality of driver stages to turn on and off substantially simultaneously for an initial interval that can be selected to charge the input capacitance of the driver transistors to a Miller plateau. The driver control signal generator may be responsive to the slew time interval indication signal to gate the element.

The driver may include a level shifter coupled between the driver control signal generator and the control input of the driver stages and/or a buffer coupled between the driver control signal generator and the control input of the driver stages. At least two of the driver transistors may have substantially the same or different impedances. In an embodiment, the switching transistor operates in a synchronous Buck converter and may be a high side switching transistor of a synchronous Buck converter. In another embodiment, the switching transistor operates in an H-bridge Buck Boost converter having an input driver circuit with a high side input switch and a low side input switch and an output driver circuit with a high side output switch and a low side output switch and wherein the switching transistor is one or both of the high side input switch or the low side output switch.

Also described is a method of controlling a switching transistor of a converter including providing a plurality of driver stages, each having a respective control input and an output coupled to the output of other ones of the driver stages and to the switching transistor and delaying turning on at least one of the driver stages relative to at least one other one of the driver stages. The method may include turning on at least two of the driver stages during a slew time interval that commences when a Miller plateau of the switching transistor is reached and terminates when a source to drain voltage of the switching transistor reaches a final voltage level.

Features may include one or more of the following. Providing a plurality of driver stages may include providing a plurality of driver transistors, each having a gate terminal providing the control input, a source terminal, and a drain terminal and coupling the drain terminal of the driver transistors together and to the switching transistor. The method may include generating a plurality of driver control signals for coupling to the plurality of driver control inputs and delaying turning on at least one of the driver stages may include using a delay element to generate at least one of the driver control signals. The plurality of driver stages may be turned on and off substantially simultaneously for an initial interval in response to a slew time interval indication signal. The initial interval may be selected based on a Miller plateau. The delay element may be gated with the slew time interval indication signal. The level of the plurality of driver control signals may be shifted and the method may include buffering the plurality of driver control signals.

BRIEF DESCRIPTION OF THE DRAWINGS

The foregoing features of the disclosure, as well as the disclosure itself may be more fully understood from the following detailed description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

Figure 7:
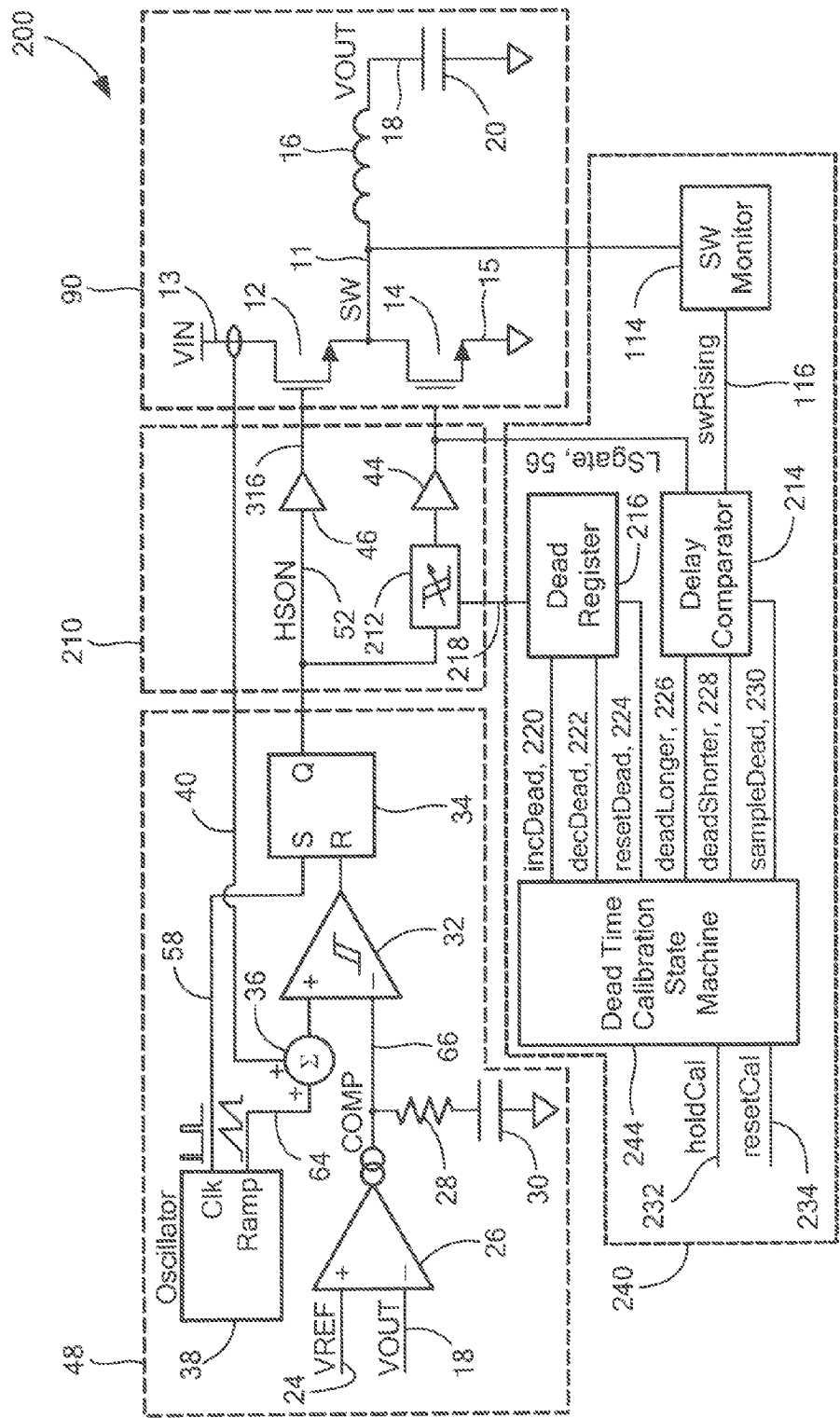
FIG. 7 is a schematic of a switching regulator having a dead time calibrator.
Figure 9:
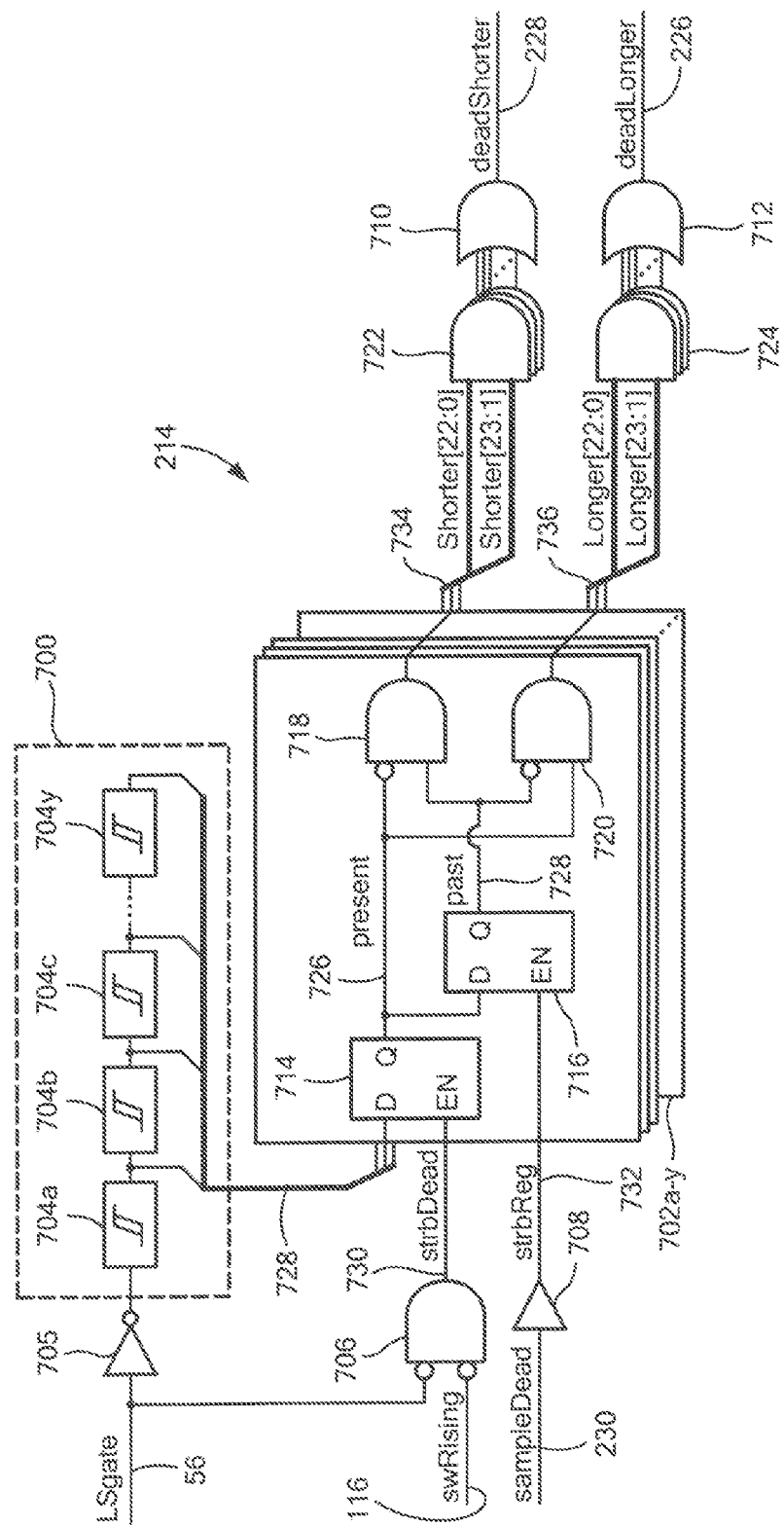
Figure 10:
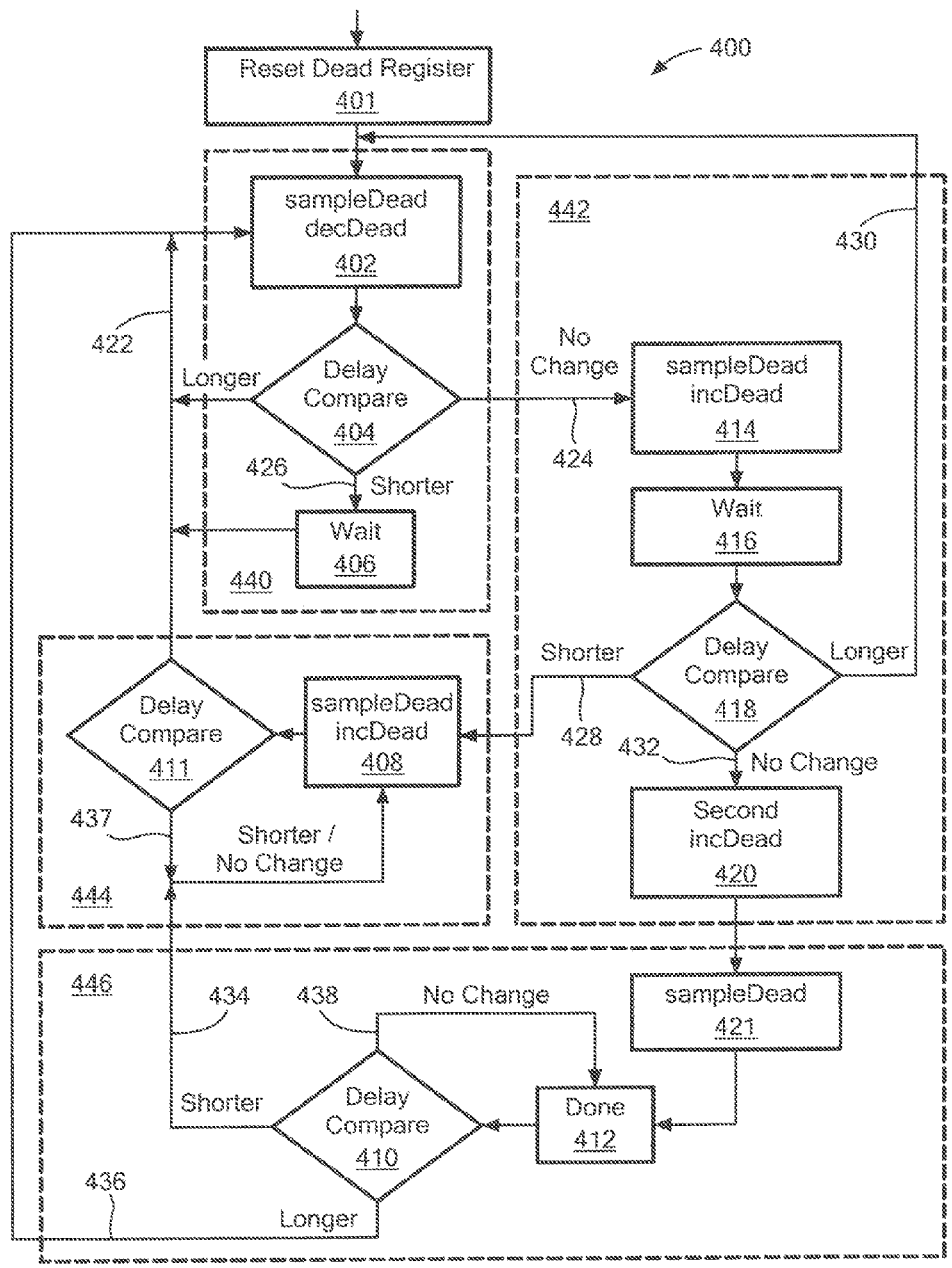
Figure 11:
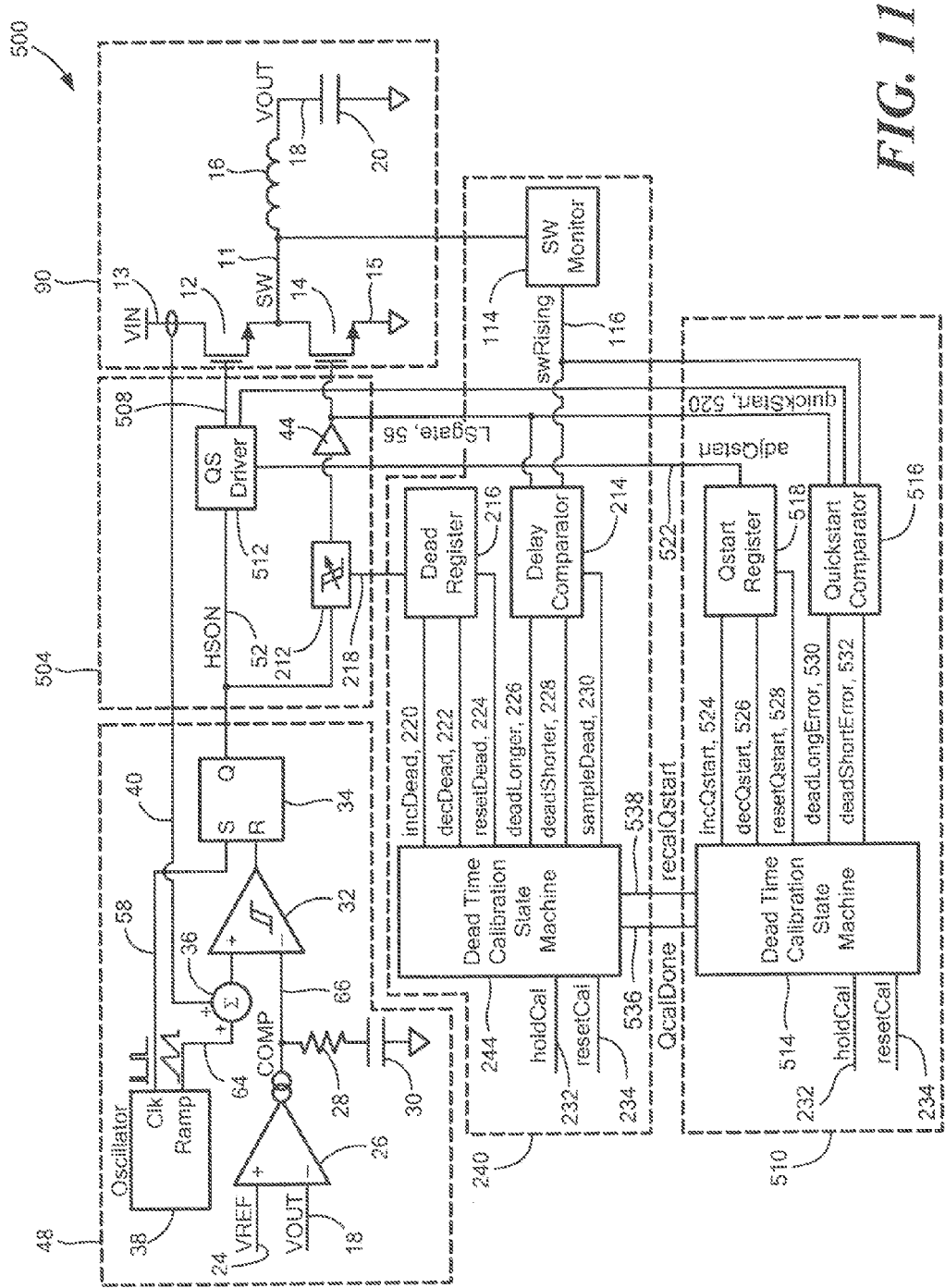
Figure 12:
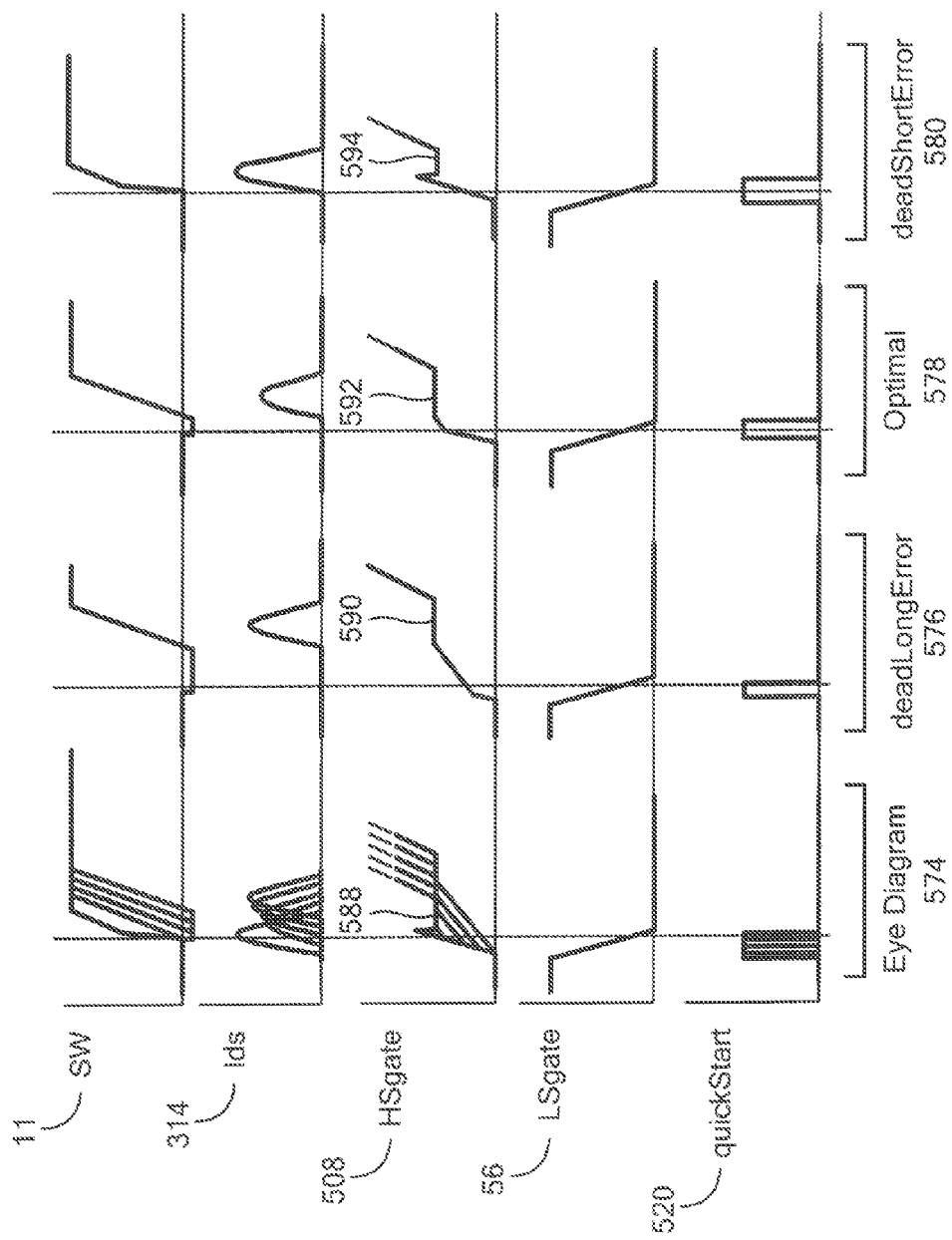
Figure 13:
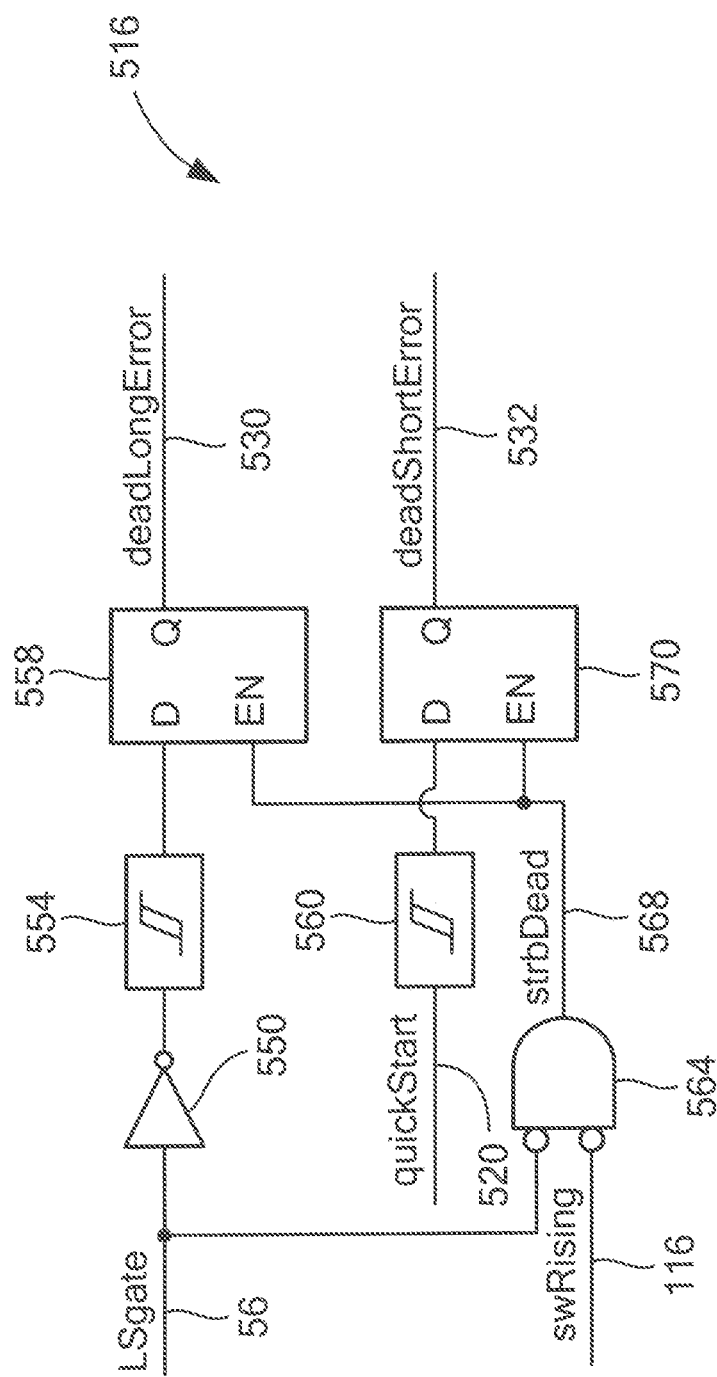
Figure 14:
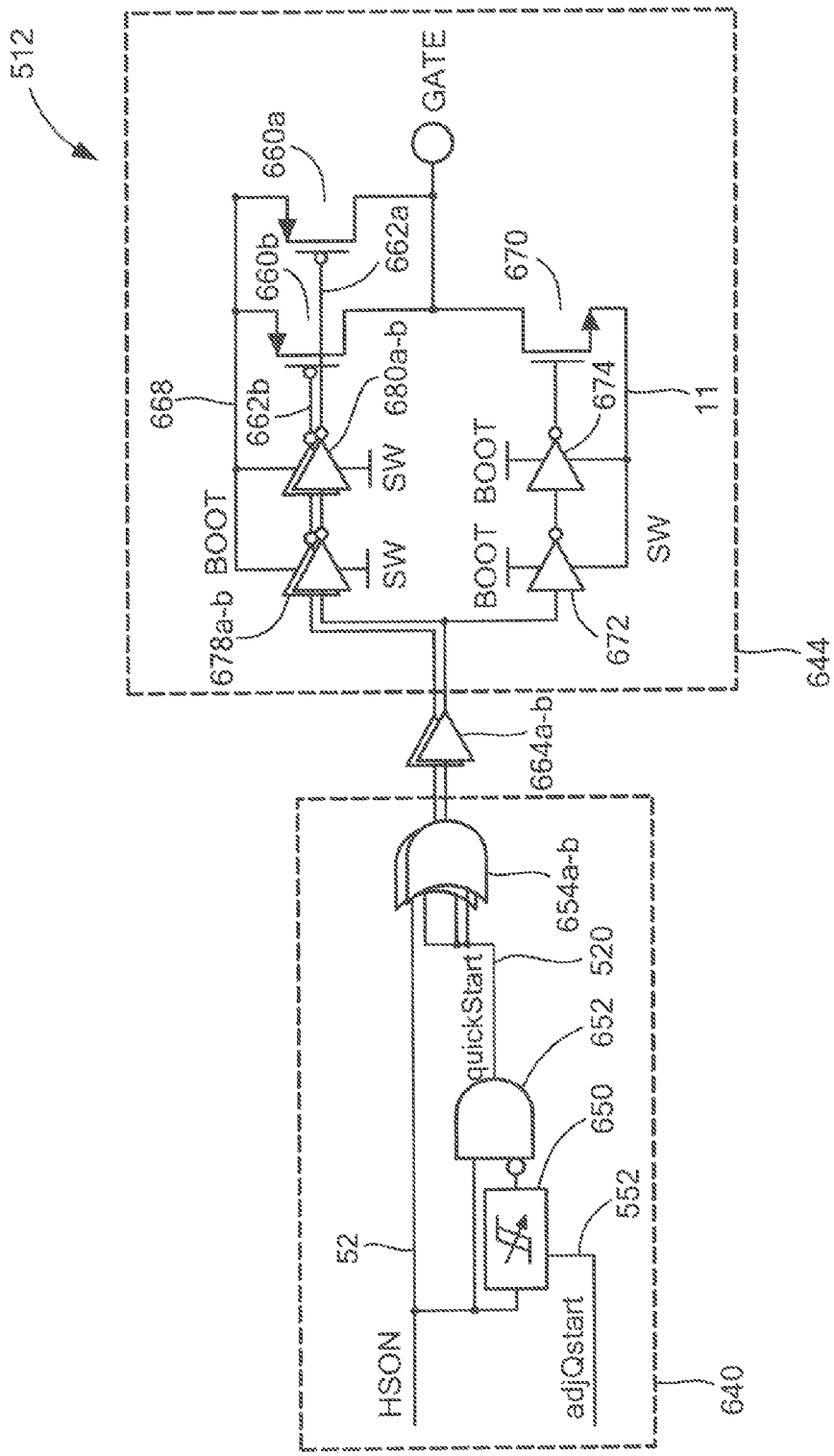
Figure 15:
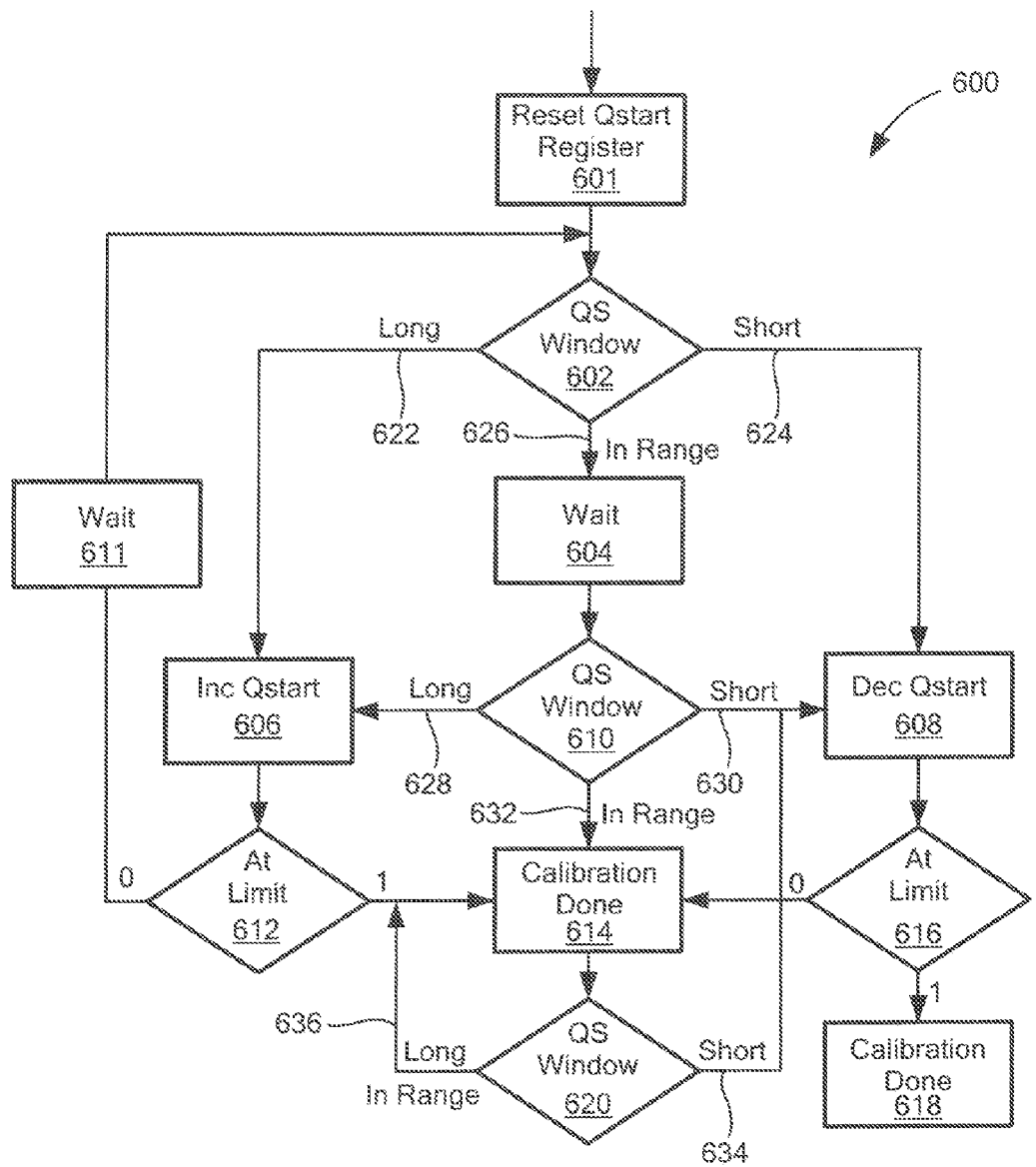
Figure 16:
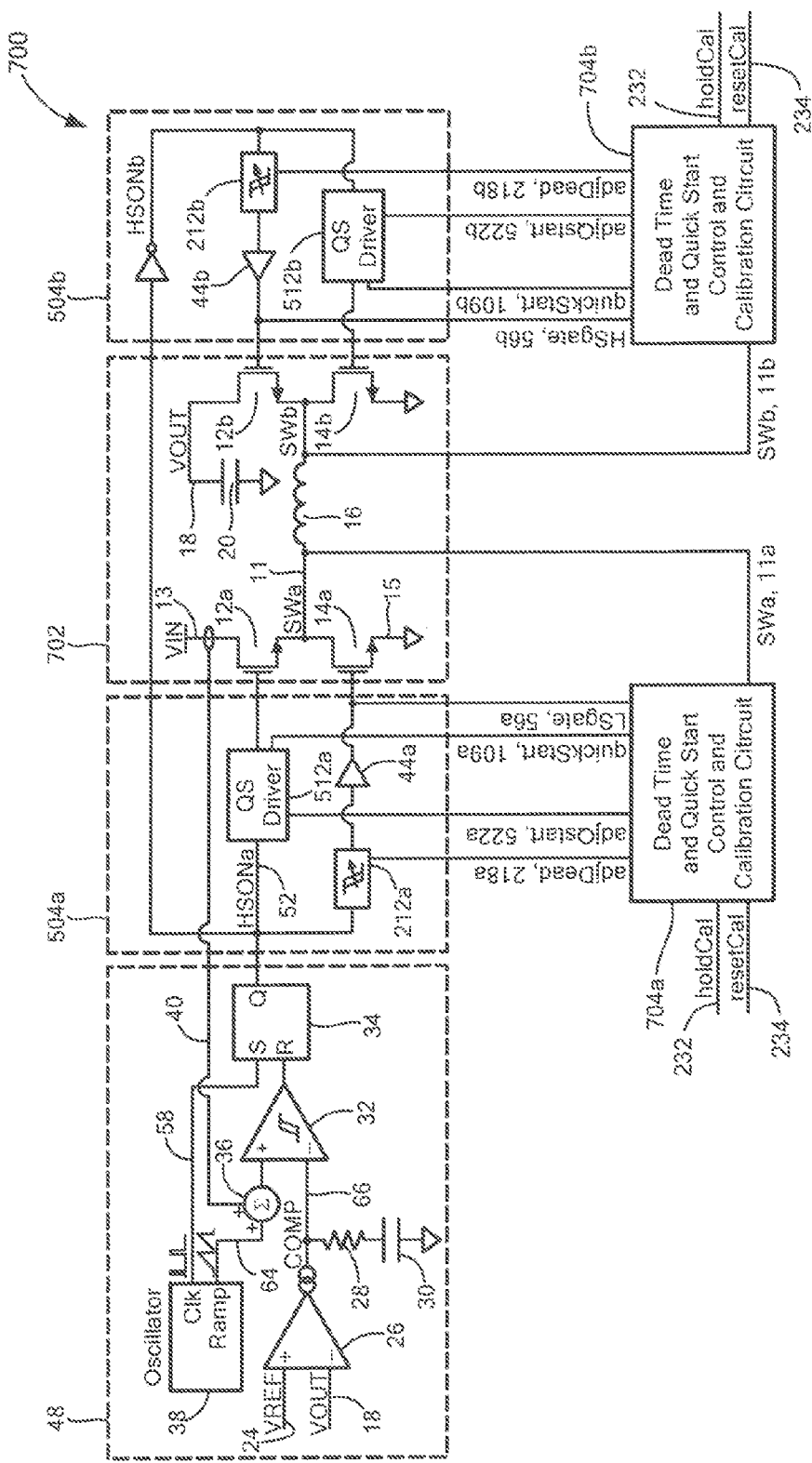

FIG. 9 is a schematic of an example delay compare circuit of FIG. 7;

FIG. 10 is a flow diagram illustrating a method of calibrating the dead time with the dead time calibrator of FIG. 7;

FIG. 11 is a schematic of an alternative switching regulator having a dead time calibrator and a quick start controller;

FIG. 12 shows several illustrative waveforms associated with the regulator of FIG. 11 for different operating conditions;

FIG. 13 is a schematic of an example quick start comparator of FIG. 11; and FIG. 14 is a schematic of the quick start driver of FIG. 11;

FIG. 15 is a flow diagram illustrating a method of calibrating the quick start interval with the quick start controller of FIG. 11;

FIG. 16 is a schematic of another alternative switching regulator having a dead time calibrator and a quick start controller.

DETAILED DESCRIPTION

Figure 1:
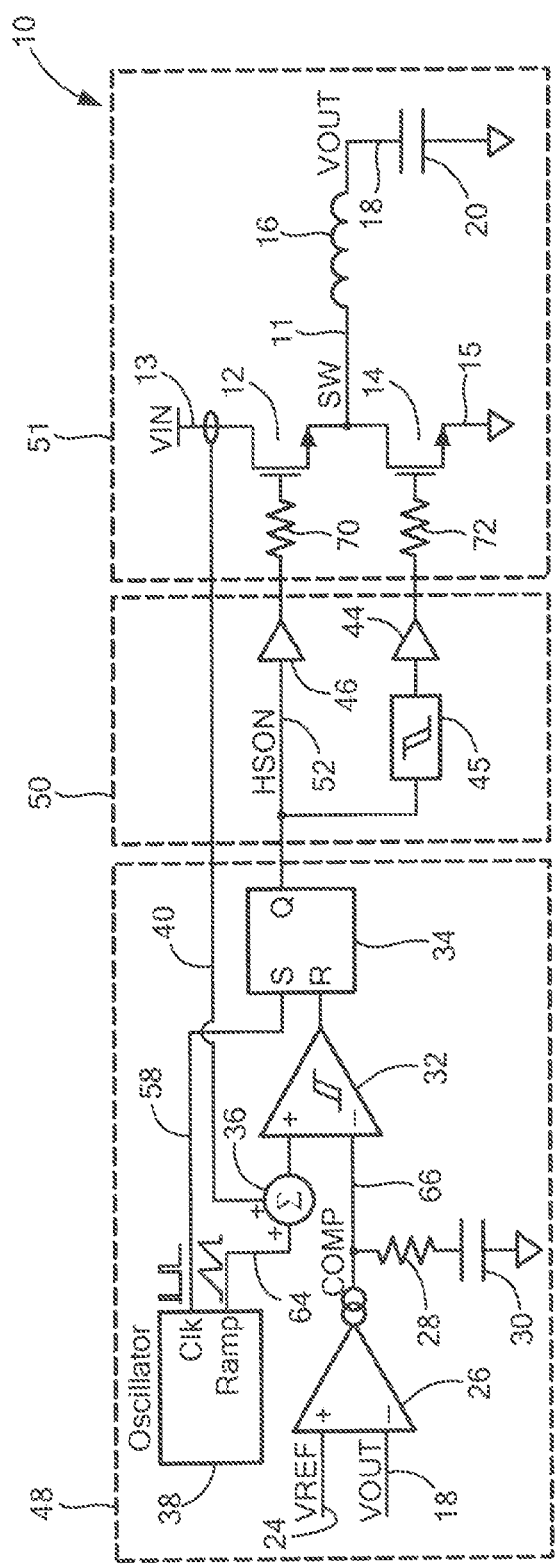
FIG. 1 is a schematic of a conventional switching regulator.
Figure 2:
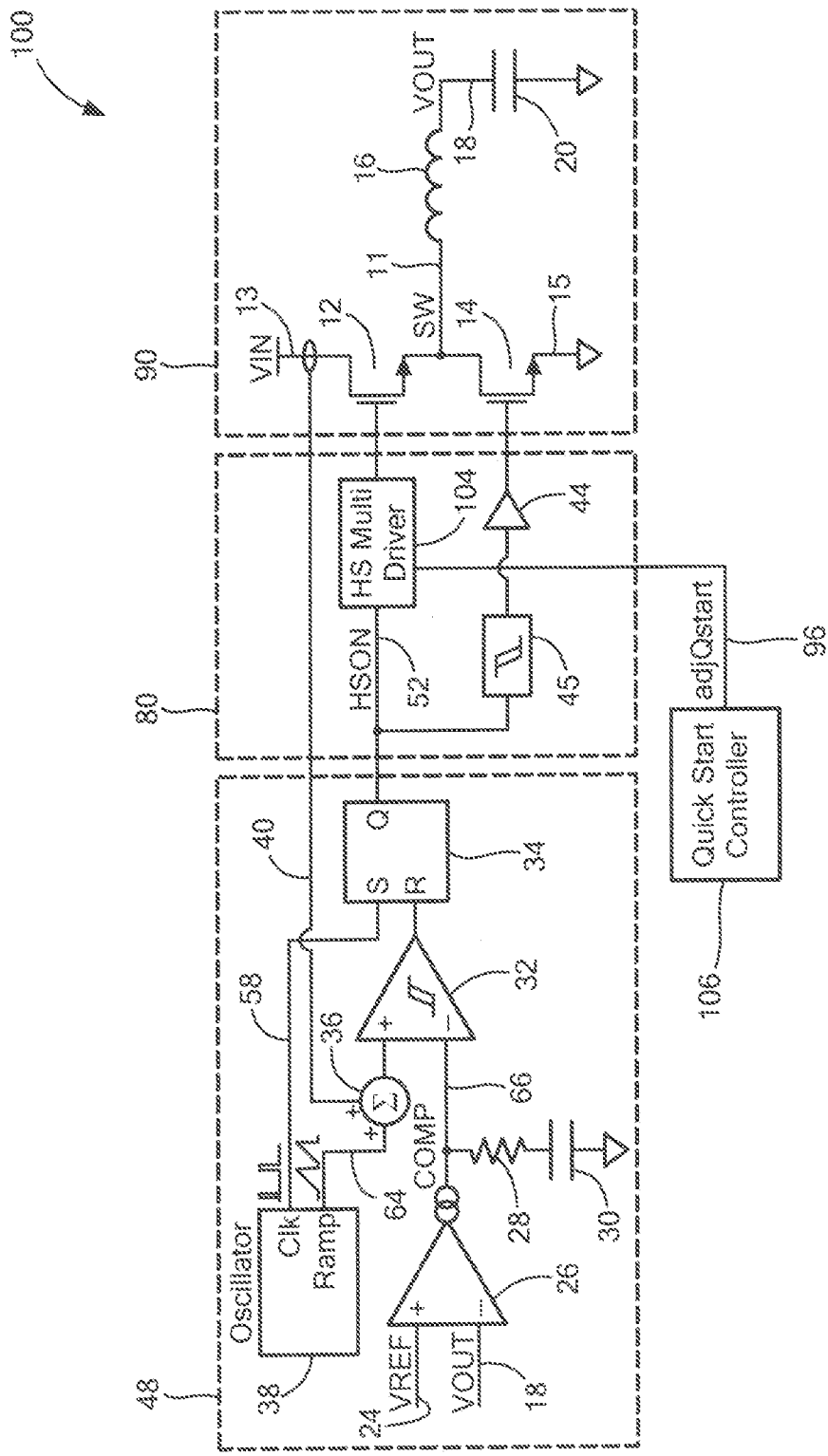
FIG. 2 is a schematic of a switching regulator having a multi-stage driver circuit and a quick start controller.

Referring to FIG. 2, a switching regulator 100 includes control circuit 48, a driver circuit 80, and regulator circuitry 90. The driver circuit 80 differs from the driver circuit 50 (FIG. 1) in that a multi-stage driver circuit 104 replaces the buffer 46 and the regulator additionally includes a quick start controller 106 that generates a quick start adjustment signal adjQstart 96 for coupling to the multi-stage driver 104. The multi-stage driver circuit 104 provides a controlled slew rate to the high side switch 12 that is tailored to the size of the FET (i.e., to the switch capacitance). The quick start adjustment signal 96 establishes an initial driver interval (referred to herein alternatively as a quick start interval) during which the switch 12 is quickly charged to a point at or near its Miller plateau and also serves to initiate operation of the multi-stage driver circuit 104. The regulator circuitry 90 differs from the converter circuitry 51 of FIG. 1 in that resistors 70, 72 are eliminated, as is made possible by operation of the multi-stage driver circuit 104.

Figure 3:
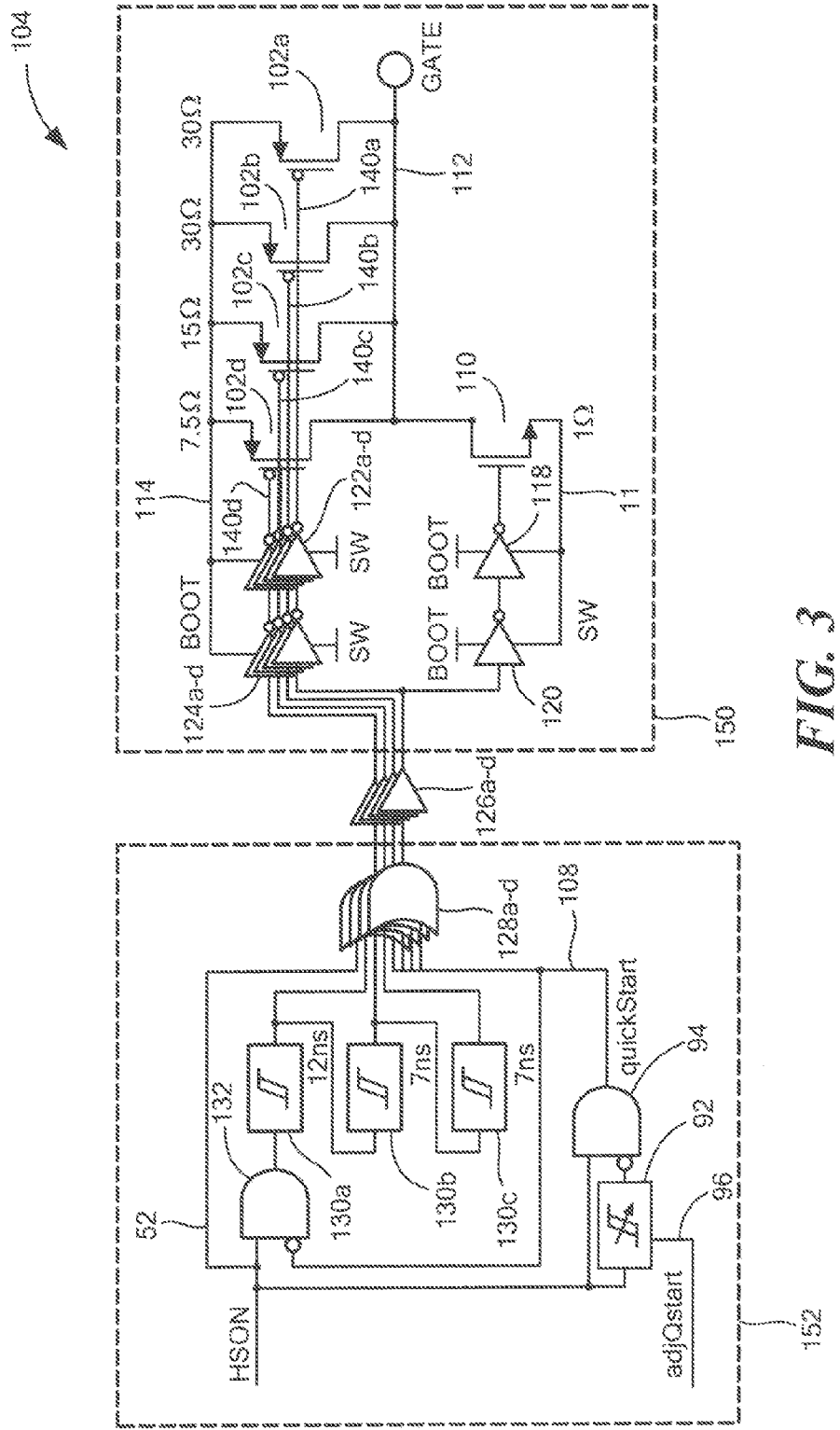
FIG. 3 is a schematic of the multi-stage driver circuit of FIG. 2.

Referring also to FIG. 3, an example multi-stage driver circuit 104 includes a driver control signal generator 152 and driver stage circuitry 150. The driver stage circuitry 150 includes a plurality of driver stages 102a-102d, each having a control input responsive to a respective driver control signal 140a-140d generated by the driver control signal generator 152 and an output coupled to the output of the other ones of the plurality of driver stages and to the control terminal 112 (i.e., the gate terminal) of the high side switch 12 (FIG. 2). In the illustrated embodiment, each driver stage 102a-102d includes a driver transistor, such as in the form of the illustrated PMOS FETs, having a control input provided by its gate terminal and an output provided by its source terminal. The driver transistors 102a-102d are coupled in parallel with their source terminals coupled together and their drain terminals coupled together, as shown.

Each driver control signal 140a-140d has an on time during which the respective driver transistor is on and an off time during which the respective driver transistor is off. At least one of the driver control signals 140a-140d has an on time that is delayed with respect to an on time of another one of the driver control signals. With this arrangement, the driver stages 102a-102d are sequentially turned on to establish a controlled slew rate. As more driver stages are turned on, the total impedance of the parallel driver stages decreases in order to thereby allow the gate terminal 112 of the high side switch 12 to charge more quickly than otherwise possible.

A slew time interval of a switch, such as the high side switch 12 (FIG. 2), can be described as commencing when the gate to source voltage of the switch reaches its Miller plateau and ending when the source to drain voltage reaches its final voltage level. In the illustrated regulator 100, the final voltage level of the source to drain voltage of switch 12 is substantially equal to the input voltage VIN 13. The slew time interval coincides generally with the interval during which the switch node voltage SW 11 (FIG. 2) rises.

The Miller plateau is an effect that is often observed during transitions between a FET's off and on states that manifests itself as a flattening of the gate to source voltage during a portion of the transition. It is caused by the transistor's gate to drain parasitic capacitance (Cgd) pushing down on the gate voltage while the source and/or drain voltage slews, which causes the gate to source voltage to temporarily slow down or cease the increase (or decrease) in gate voltage (appearing as a plateau on the Vgs versus time plot). The Miller plateau voltage is a function of the transistor's threshold voltage, the application's load current, and the transistor's on resistance.

In an embodiment, at least two of the driver stages 102a-102d are on during the slew time interval of the switch 12. With this arrangement, the multi-stage driver 104 provides decreasing impedance at the gate 112 of the switch 12 during the slew time interval in order to thereby speed up charging the gate to drain capacitance resulting in a change in the slew rate of the source to drain voltage.

The driver control signal generator 152 includes at least one delay element, and here three delay elements 130a-130c, to generate the driver control signals 140a-140d, in response to the HSON signal 52 and a quick start signal 108. The quick start adjustment signal 96 is coupled to control an adjustable delay element 92. The output of delay element 92 and the HSON signal 52 are coupled to AND gate 94 that generates the quick start signal 108, as shown.

A logic gate 132 receives the HSON signal 52 and the quick start signal 108 and provides an output signal to start the first delay element 130a on the falling edge of the quick start signal. The output of the first delay element 130a is coupled to an input of the second delay element 130b and the output of the second delay element 130b is coupled to an input of the third delay element 130c, as shown. In an example driver 104, the first delay element 130a provides a 12 ns delay, the second delay element 130b provides a 7 ns delay, and the third delay element 130c provides a 7 ns delay. Logic gate 128a receives the HSON signal 52 and logic gates 128b-128d receive the outputs of the three delay elements 130a-130c, respectively, and each gate 128a-128d additionally receives the quick start signal 108. This configuration results in the first driver stage (102a) being on when the HSON signal 52 is active.

In the illustrated embodiment, the driver control signal generator 152 is implemented on a "low side" of the regulator 100 in the sense that its signal levels are logic signal levels; whereas, the driver stage circuitry 150 is on a "high side" of the regulator, with the SW node signal level ranging from VIN 13 (FIG. 2) to ground. The BOOT signal 114 may be provided by a bootstrap capacitor (not shown) connected between BOOT and the switch node SW 11 in order to maintain the required gate drive voltage. The bootstrap capacitor may be charged when the SW node 11 approaches ground, such as with a diode connected to a voltage source. Level shifters 126a-126d are coupled between respective outputs of OR gates 128a-128d and the driver stage circuitry 150 in order to translate the logic level signals associated with the OR gates 128a-128d to high side signal levels for coupling to the driver stage circuitry 150.

It will be appreciated that while, in the illustrated multi-stage driver 104, the driver control signal generator 152 is implemented on the low side, this signal generating circuitry could alternatively be implemented on the high side, thereby reducing the required number of level shifters 126a-126d. The decision to implement the signal generator 152 on the low side versus the high side impacts silicon area, ESD protection, and other factors depending on the process. For example implementing delay cells 130a-130c on the high side can result in a larger physical circuit for each delay cell, but to implement them on the low side requires more level shifters, which also requires more physical area.

In addition to the plurality of driver stages 102a-102d, the driver stage circuitry 150 includes pre-driver buffer stages 124a-124d and 122a-122d. The buffer stages are sized to achieve a predetermined gate drive level for the driver stages 102a-102d and each buffer stage may have the same or different drive capability. It will be appreciated that additional or fewer pre-driver buffer stages may be provided. Here, the buffers 122a-122d and 124a-124d are provided in the form of inverters.

One of the level shifted signals, here a signal from level shifter 126a that corresponds to the delayed signal 140a that controls the first driver stage 102a, is coupled to a buffer inverter 120 for further coupling to a buffer inverter 118 and to a gate terminal of a NMOS FET 110. The NMOS FET 110 has a drain terminal coupled to the gate terminal 112 of the high side switch 12 (FIG. 2) and a source terminal coupled to the switch node SW 11 (FIG. 2). In operation, the NMOS transistor 110 is off when any of the PMOS driver transistors 102a-102d is on.

Figure 4:
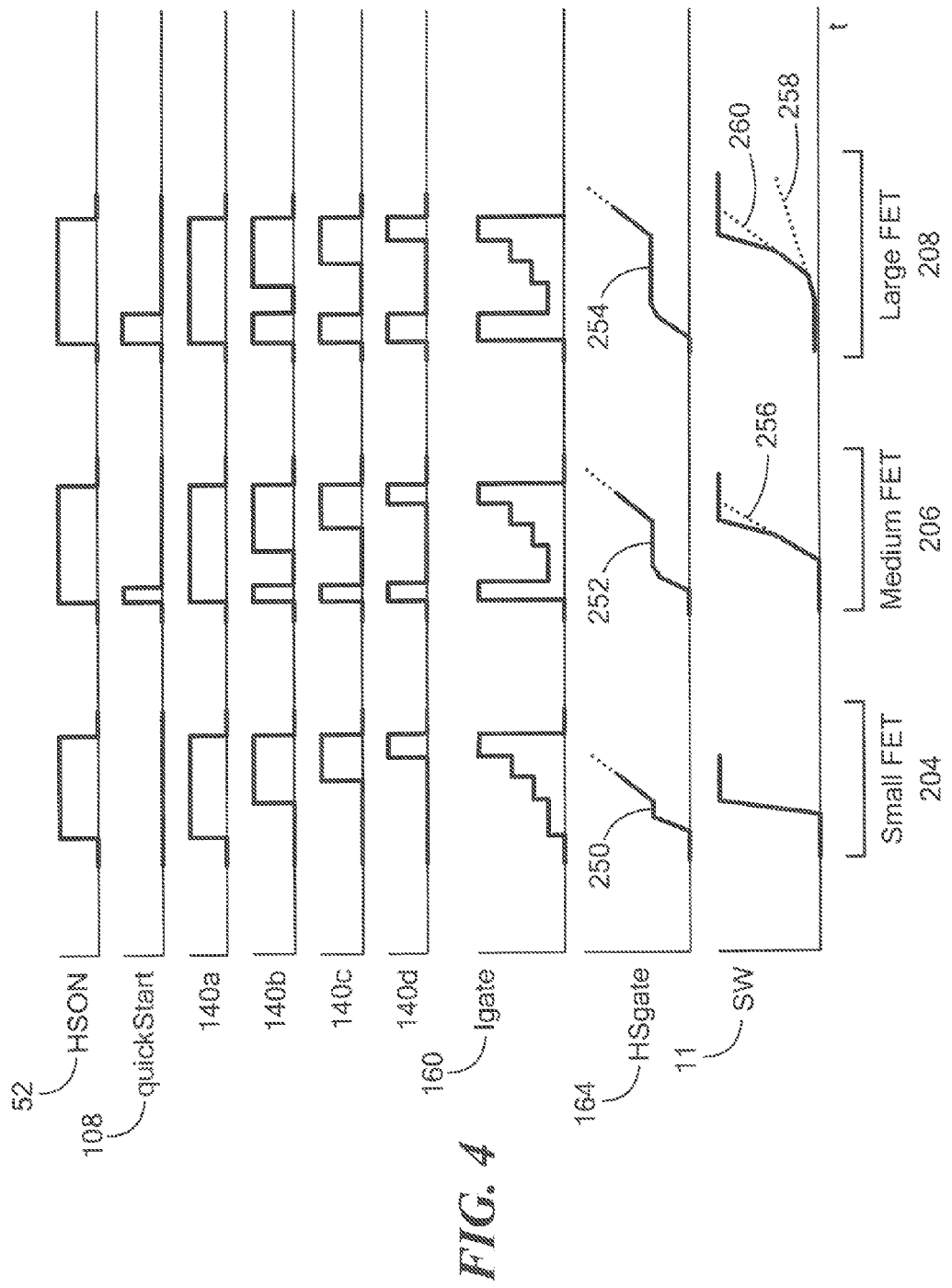
FIG. 4 shows several illustrative waveforms associated with the regulator of FIG. 2 when the multi-stage driver drives switching transistors of different sizes.

Referring also to the illustrative waveforms of FIG. 4, operation of the multi-stage driver 104 will be explained. FIG. 4 shows an example HSON signal 52 and quick start signal 108. Also shown in FIG. 4 are the driver control signals 140a-140c, the gate current Igate 160 of the high side switch 12 (FIG. 2), the gate to source voltage, HSgate 164 of the switch 12, and the switch node voltage SW 11.

Each of the illustrated signals is shown in connection with driving three different high side switches 12, each having a different size and therefore different input capacitance. A first portion 204 of the waveforms illustrates the respective signals when the multi-stage driver circuit 104 is coupled to a relatively small high side FET 12 with a relatively small input capacitance, a second portion 206 of the waveforms illustrates the signals when the multi-stage driver circuit 104 is coupled to a medium sized FET 12, and a third portion 208 of the waveforms illustrates the signals when the multi-stage driver circuit 104 is coupled to a relatively large FET 12.

Details of the quick start controller 106 (FIG. 2) are described below in connection with quick start control and calibration circuit 510 of FIG. 11. Suffice it to say here that under certain operating conditions (e.g., when driving a transistor 12 of a certain size), the quick start signal 108 (via OR gates 128a-128d) turns on all of the gate drive stages 102a-102d initially, at the rising edge of the HSON signal 52, for a quick start interval that ends when the gate to source voltage, HSgate 164 is at or near (but not above) the Miller plateau as is labeled 252 for the medium sized FET 206 and 254 for the large FET 208. The quick start signal 108 is provided in the form of a pulse that commences in response to a transition of the HSON signal 52 and ends when the switch node voltage SW 11 starts to rise. In this way, the end of the quick start pulse or interval can be considered to provide an indicator of the start of the slew time interval and/or the transistor being at or near its Miller plateau. Use of the quick start signal 108 to quickly charge the transistor to a point at or near its Miller plateau can reduce the total duration of the transition of the gate to source voltage Vgs of the transistors.

Following the quick start interval, all but the first driver stage 102a (driven by the HSON signal) is turned off (i.e., driver control signal 140a stays high rather than going low to turn off driver stage 102a). Stated differently, the quick start pulse 108 turns on all of the drive stages 102a-102d with its rising edge and turns off all but the first drive stage 102a with its falling edge. Thereafter, the second through fourth driver stages are turned on by respective driver control signals 140b-140d according to their respective delays, as shown.

The first portion 204 of the waveforms of FIG. 4 corresponds to driving a high side FET 12 that is so small that it does not receive a quick start pulse 108. Here, at the rising edge of the HSON signal 52, the first driver control signal 140a transitions to a high state to turn on the first driver stage 102a. A first delay time later, here 12 ns later as established by delay element 130a, the second driver control signal 140b goes high to turn on the second driver stage 102b. Subsequently, after a second delay time of 7 ns as established by delay element 130b, the third driver control signal 140c goes high to turn on the third driver stage 102c and finally, after a third delay time of 7 ns as established by delay element 130c, the fourth driver control signal 140d goes high to turn on the fourth driver stage 102d.

As is apparent from consideration of the waveform portions 204 associated with driving the smallest FET 12, 206 associated with driving a medium sized FET 12, and 208 associated with driving the largest FET 12, different numbers of driver stages 102a-102d may be turned on during the slew time interval depending on the capacitance of the driver FET. For example, in the case of the smallest FET, only the first driver stage 102a is required to charge the SW node 11 to the VIN voltage level (i.e., only one driver stage 102a is on during the slew time interval). In the case of the medium sized FET, the first and second driver stages 102a, 102b are required in order to charge the SW node 11 to the VIN voltage level (i.e., two driver stages 102a, 102b are on during the slew time interval). A dotted line waveform labeled 256 illustrates what the switch node voltage SW 11 would look like if only a single driver stage (e.g., 102a) were on during the slew time interval. And in the case of the largest FET, three driver stages 102a, 102b, and 102c are required in order to charge the SW node 11 to the VIN voltage level (i.e., three driver stages 102a, 102b, and 102c are on during the slew time interval). A dotted line waveform labeled 260 illustrates what the switch node voltage SW 11 would look like if only the first and second driver stages 102a, 102b were on during the slew time interval and a dotted line waveform labeled 258 illustrates what the switch node voltage SW 11 would look like if only the first driver stage 102a were on during the slew time interval.

It will be appreciated that the delay elements 130a-130c may provide the same delays or different delays. Various considerations may be used to select the delays provided by the delay elements in order to ensure that a predetermined slew time interval is achieved for all possible sizes of driven FETs. As one example, the delays can be selected to achieve the predetermined slew time interval for the smallest driven FET with only a first driver transistor 102a on and to require some additional number of driver transistors to be on to achieve the same predetermined slew time interval for the largest driven FET. In the example multi-stage driver 104, the first delay element 130a establishes a longer delay (i.e., 12 ns) than the second and third delay elements 130b, 130c in order to provide some time for the first stage to drive the gate to source voltage to the Miller plateau, whether the quick start signal 108 is present or not. Preferably the quick start interval (when the quick start signal 108 is active) is not present during the Miller plateau.

As is apparent from the driver control signals 140a-140d, in the illustrated embodiment, each stage is sequentially turned on such that a subsequent stage is turned on while the stage(s) that were previously on remain on in order to thereby achieve a total driver impedance equal to the parallel combination of the impedances of all of the active driver stages. It will be appreciated that other sequencing schemes are also possible. Further, while the example multi-stage driver 104 includes four driver stages 102a-102d, other numbers of stages are possible.

The impedance of the driver transistors 102a-102d may be the same as each other or may be different in order to achieve a desired scaling of the total parallel impedance as driver stages are turned on. In an embodiment, the impedance of driver stage 102a is 30Ω, the impedance of driver stage 102b is 30Ω, the impedance of driver stage 102c is 15Ω and the impedance of driver stage 102d is 5Ω. With this arrangement, during a first time interval, when only the first driver stage 102a is on, the total driver impedance is 30Ω, during a second time interval when both the first driver stage 102a and the second driver stage 102b are on, the total driver impedance is 15Ω, during a third time interval when driver stages 102a, 102b, and 102c are on, the total driver impedance is 7.5Ω, and during a fourth time interval when all four driver stages 102a-102d are on, the total driver impedance is 3Ω.

Referring again to FIG. 3, multiple driver stages 102a-102d are only used for the pull up devices (i.e., the PMOS FETs) of the driver circuit 104. Additionally or alternatively, the multi-stage driver approach can be applied to the pull down gate drive (i.e., NMOS FET 110) or to the low side switch (i.e., FET 14), which can be required by different switcher topologies, such as an inverted buck LED driver topology where the inductor current flows in the opposing direction of the illustrated embodiment. The multi-stage driver approach may also be desirable on the low side of an H-Bridge buck-boost regulator constructed with two switch nodes SW, with a high side multi-stage driver on the input switch node SW and a low side multi-stage driver on the output switch node SW, as will be described in connection with FIG. 16. In the illustrated embodiment, the pull up devices are focused on because controlling the slew rate of the SW rising edge can be more important than the falling edge. Since, during this transition, current is being sourced from the input supply VIN, which has a relatively large current loop, the slew rate of the rising edge of the switch voltage SW 11 can have more of an impact on EMI/EMC performance. In contrast, for the switch node SW 11 falling edge, the load current is being transitioned to ground, which will have tighter associated current loops and therefore less of an impact on EMI/EMC performance. Other embodiments may have need for the multi-stage driver approach applied to the pull down gate drive.

In addition to quickly charging the switch 12 gate 112 to a point at or near its Miller plateau, the quick start signal 108 can also be used as a mechanism for initiating operation of the multi-stage driver 104 by operation of gate 132 (FIG. 3). It will be appreciated that this functionality can be achieved with alternative circuits and techniques, such as an adaptive quick start period, a pre-programmable quick start period, or other methods.

Figure 5:
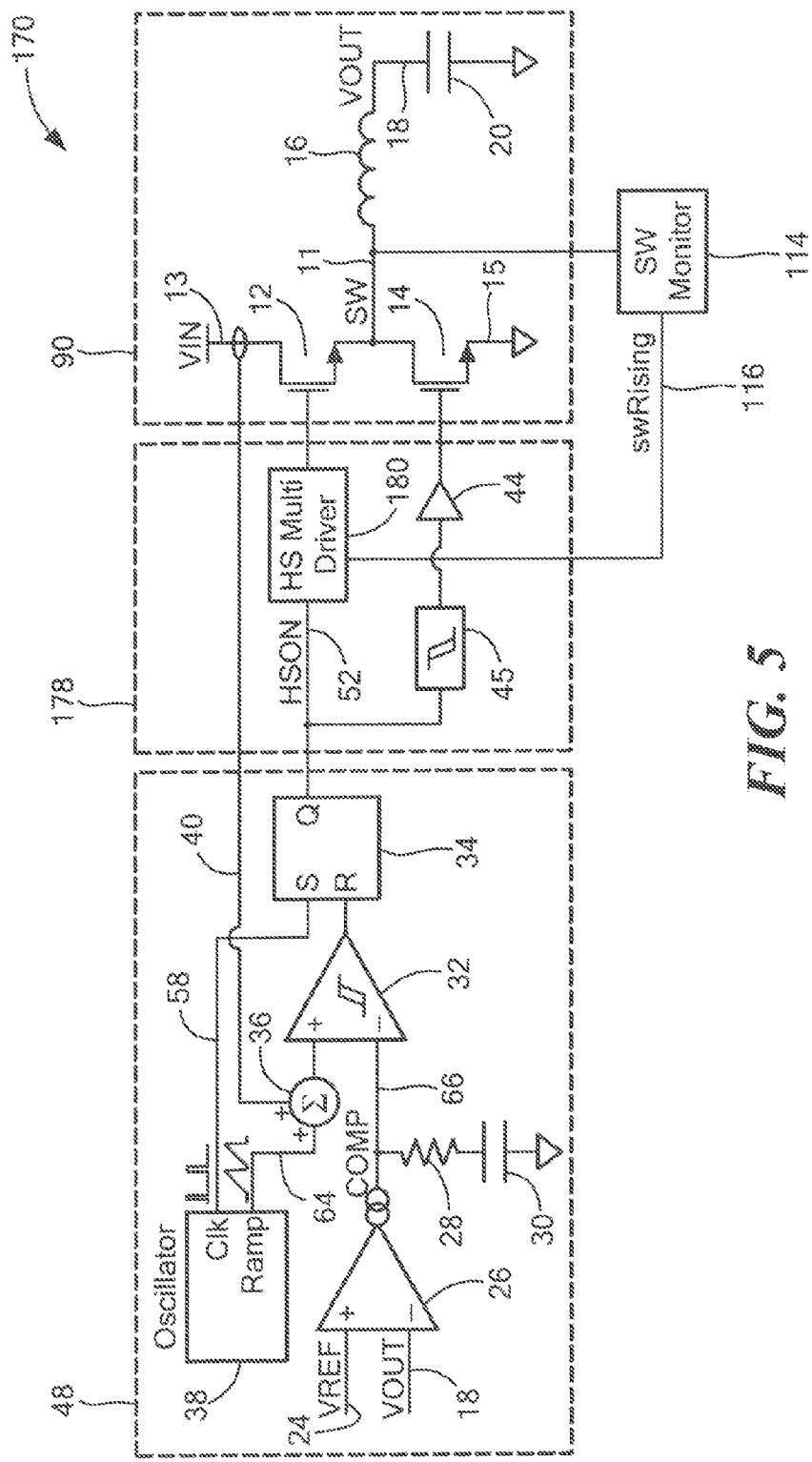
FIG. 5 is a schematic of an alternative switching regulator having a multi-stage driver and a switch monitor circuit.

Furthermore, the multi-stage driver can be implemented without a quick start interval. One such alternative regulator 170 that does not include a quick start interval to more quickly charge the FET 12 to its Miller plateau is shown in FIG. 5. Regulator 170 differs from the regulator 100 (FIG. 2) in that the quick start controller 106 is replaced with a switch node monitor 114 that generates a swRising signal 116 and the multi-stage driver 104 is replaced with an alternative multi-stage driver circuit 180 that responds to the swRising signal 116 rather than to a quick start adjustment signal. In this implementation the falling edge of quick start signal 108 is analogous to the rising edge of the swRising signal 116. However, the falling edge of quick start signal 108 occurs before the start of the Miller plateau and the rising edge of the swRising signal 116 occurs after the Miller plateau.

The swRising signal 116 is used to initiate operation of the multi-stage driver 104. More particularly, the swRising signal 116 provides an indicator of the start of the slew time interval. To this end, switch node monitor 114 monitors the voltage at the switch node SW 11 to determine when the switch 12 has reached its Miller plateau and may include a comparator to compare the switch node voltage SW 11 to a reference voltage selected so that a transition of the swRising signal 116 (e.g., a transition to a logic high level) coincides generally to the switch 12 reaching its Miller plateau as can be determined by monitoring when the switch node voltage starts to rise. Thus, the swRising signal 116 is at a first logic level when the switch node voltage SW 11 is greater than the reference voltage and is at a second logic level when the switch node voltage SW 11 is less than the reference voltage. The switch node monitor comparator may include hysteresis. In some embodiments, the reference voltage may be user programmable or otherwise programmable or adjustable. In order to better reject variations in the rise time of the switch node voltage SW 11, it may be desirable to provide the reference voltage at a relatively low level, such as on the order of 1 volt for a 12 volt supply, or more generally, on the order of approximately 10% of the supply voltage VIN. It is also desirable for the delay between the SW node voltage 11 rising edge and the swRising signal 116 to be as small as possible. The swRising signal could also be generated by monitoring the HSgate signal with a threshold configured below the Miller plateau; however, the Miller plateau is often an unknown voltage.

Figure 6:
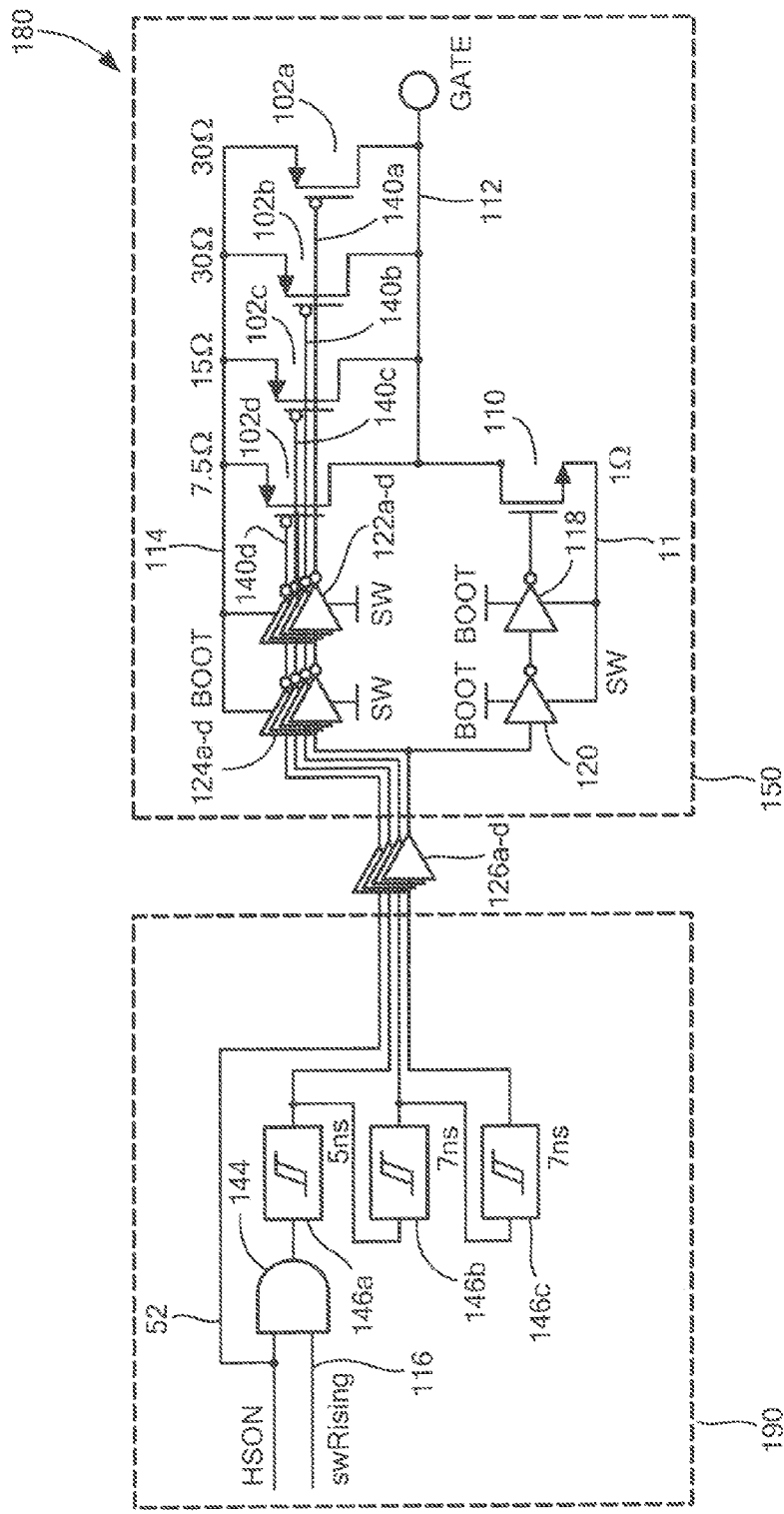
FIG. 6 is a schematic of the multi-stage driver of FIG. 5.

Referring also to FIG. 6, the multi-stage driver circuit 180 includes a driver control signal generator 190 and driver stage circuitry 150. The driver control signal generator 190 includes an AND gate 144 that receives the HSON signal 52 and the swRising signal 116, as shown. Thus, the output of gate 144 transitions to a high level upon a rising edge of the swRising signal 116 and transitions to a low level once the HSON signal 52 transitions to a low level to indicate that the Miller plateau has been reached. The driver control signal generator 190 includes three delay elements, here elements 146a-146c, each providing a respective delay. In an embodiment, delay element 146a establishes a delay of 5 ns, delay element 146b establishes a delay of 7 ns, and delay element 146c establishes a delay of 7 ns. With this arrangement, a first control signal 140a turns on and off the first driver stage 102a according to the timing of the HSON signal 52, a second control signal 1406b turns on the second driver stage 102b 5 ns after the swRising signal 116 rising edge (since the delay element 146a is triggered by the swRising signal 116 going high), a third control signal 140c turns on the third driver stage 102c 7 ns after the second driver stage 102b is turned on, and a fourth control signal 140d turns on the fourth driver stage 102d 7 ns after the third driver stage 102c is turned on. In this way, the swRising signal 116 initiates operation of the multi-stage driver 180 in the same fashion as the quick start signal 108 (FIG. 3) such that the delayed driver control signals commence at a controlled time following a transition of the swRising signal 116 that indicates the beginning of the slew time interval, but here without the initial quick start charging implemented by the quick start signal 108 (FIG. 3). Here again, it will be appreciated that the delays established by delay elements 146a-146c can be readily modified.

Referring to FIG. 7, a switching regulator 200 implementing a dead time calibration includes control circuit 48 and regulator circuitry 90. The regulator 200 further includes a driver circuit 210 that differs from the driver circuit 80 (FIG. 2) in that the fixed delay element 45 is replaced with an adjustable delay element 212. A dead time control and calibration circuit, or simply control circuit, or calibrator 240 includes circuitry and implements techniques for optimizing the dead time between turning off the low side switch 14 and turning on the high side switch 12 by adjusting the delay established by the delay element 212. The dead time calibrator 240 sets a dead time adjustment to an initial value and changes the dead time adjustment while monitoring a delay between the switch node voltage SW 11 rising and the low side switch 14 turning off to determine when to stop changing the dead time adjustment based on when the delay stops changing, as will be described. It will be appreciated that while the dead time calibration circuit is described in connection with certain embodiments (FIGS. 7 and 11 for example) to optimize the dead time between turning off the low side switch 14 and turning on the high side switch, in other embodiments (FIG. 16 for example) dead time calibration optimizes the dead time between turning off the high side switch and turning on the low side switch in which case the dead time calibrator sets a dead time adjustment to an initial value and changes the dead time adjustment while monitoring a delay between the switch node voltage falling and the high side switch turning off to determined when to stop changing the dead time adjustment based on when the delay stops changing.

The switch monitor 114, as described above in connection with FIG. 5, compares the switch node voltage SW 11 to a reference voltage to generate the swRising signal 116. Thus, the swRising signal 116 is at a first logic level when the switch node voltage SW 11 is greater than a reference voltage and is at a second logic level when the switch node voltage is less than the reference voltage. In an embodiment, the reference voltage is relatively low, such as on the order of 1 volt for a 12 volt supply voltage VIN 13. In this way, the swRising signal 116 provides an indication of the switch node voltage 11 rising.

A delay comparator 214 receives the swRising signal 116, an LSgate signal 56 coupled to the gate terminal of the low side switch 14, and a sampleDead signal 230 and compares the swRising signal 116 to the LSgate signal 56 to determine a present delay between the voltages 116, 56 and also to determine whether the present delay is greater than, less than, or equal to a previously determined delay (i.e., a past delay), as will be explained below in connection with the example delay comparator 214 of FIG. 9. Outputs of the delay comparator 214 include a deadLonger signal 226 that, when high for example, indicates that the present delay is longer than the past delay and a deadShorter signal 228 that, when low for example, indicates that the present delay is shorter than the past delay. Additionally, delay comparator 214 drives both the deadLonger signal 226 and the deadShorter signal 228 low, for example, indicating that the present delay is substantially equal to the past delay.

A dead time calibration state machine 244 responds to the deadLonger signal 226 and to the deadShorter signal 228 and implements a calibration routine whereby, the dead time adjustment is either decremented or incremented or unchanged. To this end, the state machine 244 generates an incDead signal 220 to increment the dead time adjustment and a decDead signal 222 to decrement the dead time adjustment via a dead register 216.

The delay of the delay element 212 is controlled by an address 218 (i.e., by a dead time adjustment 218) from the dead register 216 and, in an embodiment, can have a width on the order of 5 bits and a LSB weight of 1-3 ns for example. The dead register 216 generates and stores the address 218 with an up/down counter controlled by the incDead signal 220 and the decDead signal 222. A resetDead signal 224 resets the register 216 to set the adjustable delay element 212 to an initial, minimum delay value, resulting in the most positive (i.e., maximum) dead time for the system.

Note that when decrementing the dead time adjustment with the decDead signal 222, the delay of the adjustable delay element 212 actually increases. Conversely, when incrementing the dead time adjustment with the incDead signal 220, the delay of the adjustable delay element 212 decreases. This inversion is the result of adjustable delay element 212 being coupled to the low side switch 14 to delay the LSgate signal 56 relative to the HSON signal 52.

As will be explained further in connection with the flow diagram of FIG. 10, the dead time calibrator 240 initially sets the dead time adjustment to an initial value (here, to a minimum adjustment value) corresponding to an initial, maximum dead time. The calibrator 240 slowly attempts to decrement the dead time by incrementing the dead time adjustment by a small step, such as on the order of between 1 and 3 nanoseconds, following which the dead time is monitored to determine if a change in the delay between the LSgate signal 56 and the swRising signal 116 (i.e., a change in the dead time) has occurred. If a change in the dead time occurs, then the dead time adjustment is again incremented and the process is repeated. Once the dead time no longer changes in response to an increment of the dead time adjustment, the dead time is determined to be negative and therefore the previous step was at or near an optimal value. Stated differently, the dead time calibrator 240 operates on the principle that the optimal dead time occurs slightly before when the relative delay between the switch node voltage SW 11 and the low side switch control signal LSgate 56 no longer changes in response to a change (e.g., an increment) of the dead time adjustment. It will be appreciated that in embodiments (e.g., FIG. 16) in which the dead time calibration controls the dead time between the high side switch turning off and the low side switch turning on, the optimal dead time occurs slightly before when the relative delay between the switch node voltage and the high side switch control signal no longer changes in response to a change of the dead time adjustment. The reason that no further change in the dead time is indicative of being at or near the transition from a positive dead time to a negative dead time is because this condition occurs when the dead time is negative. In many applications, it is desirable to have a slight positive dead time.

Figure 8:
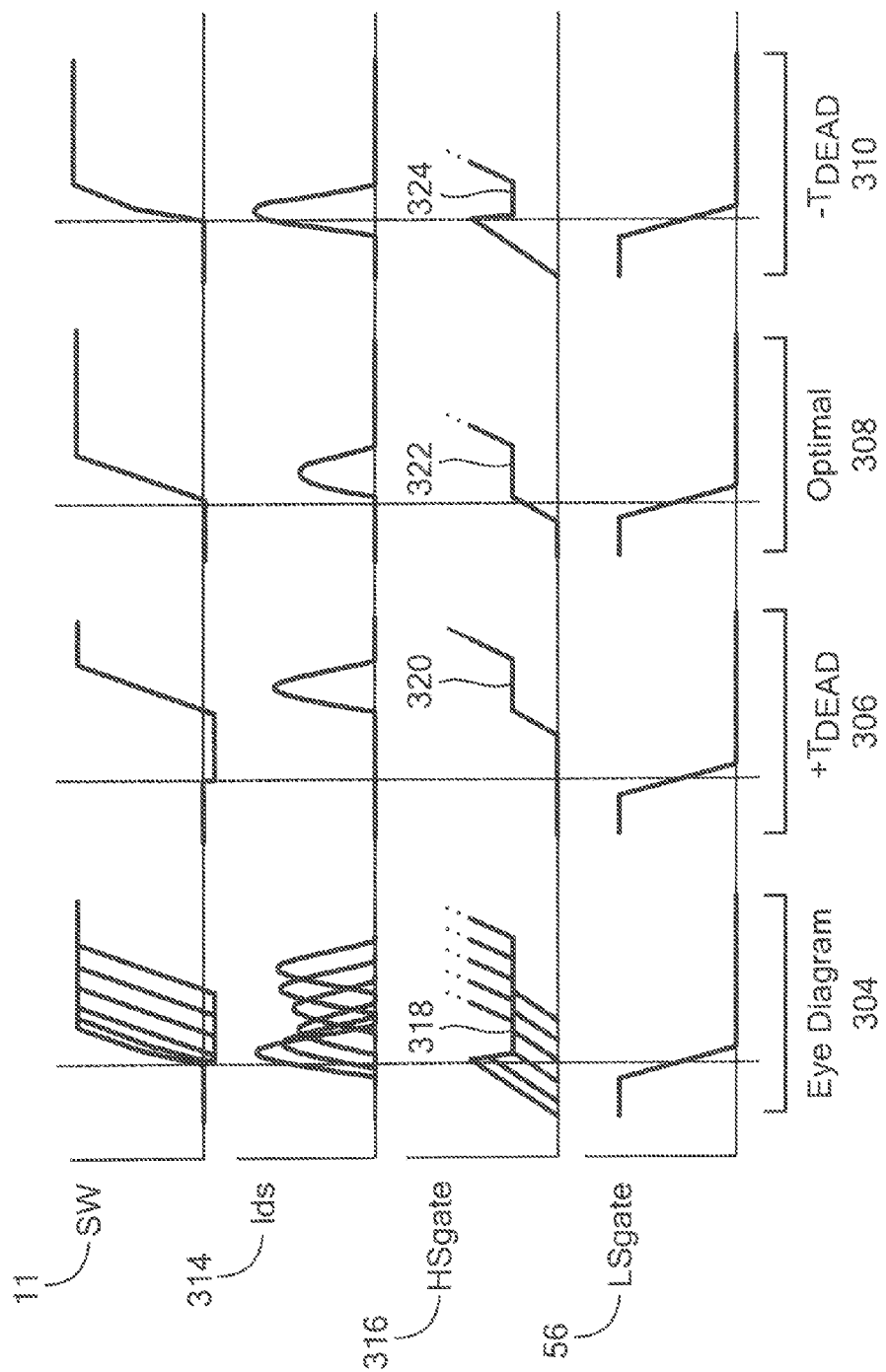
FIG. 8 shows several illustrative waveforms associated with the regulator of FIG. 7 different dead times.

Referring also to FIG. 8, example signal waveforms associated with the regulator 200 of FIG. 7 include the switch node voltage SW 11, the LSgate signal 56, the high side switch drain to source current Ids 314, and the high side switch gate to source voltage, or control signal HSgate 316. Each of the illustrated signals is shown in connection with various dead times. A first portion 304 of the waveforms illustrates the respective signals when the regulator 200 is operating with several different dead times (with the left most waveforms corresponding to the most negative dead time), a second portion 306 of the waveforms illustrates the signals when the regulator 200 is operating with a first, positive dead time, a third portion 308 of the waveforms illustrates the signals when the regulator 200 is operating with a second, optimal dead time, and a fourth portion 310 of the waveforms illustrates the signals when the regulator 200 is operating with a third, negative dead time.

As the dead time is reduced, the peak drain current 314 decreases with each step because the body diode of the low side switch 14 has less time for charge to be built up. The conduction of the low side switch 14 body diode results from the switch node voltage SW 11 going negative. When the dead time becomes negative (310), the peak of drain current 314 significantly increases due to the high side switch 12 and the low side switch 14 simultaneously conducting (shoot through current). Also as illustrated in the waveform portions 304, when the dead time crosses from positive to negative, the switch node slew rate increases dramatically. This increase in slew rate is due to excess gate to source voltage 316 on the high side FET 12 when the low side switch 14 and the high side switch 12 conduct simultaneously. As will be explained in connection with FIG. 10, the dead time calibration routine selects as the optimal dead time a dead time that is one or two steps from the point in time (i.e., the dead time adjustment 218) where relative delay between the low side switch turning off and the switch node voltage rising no longer changes.

Referring also to FIG. 9, an example delay comparator 214 is shown to receive the LSgate signal 56 and the swRising signal 116 and to provide the deadLonger signal 226 and the deadShorter signal 228. The delay comparator 214 is additionally responsive to a sampleDead signal 230 from the dead time calibration state machine 244 (FIG. 7). The delay comparator 214 measures and stores the present delay between the LSgate signal 56 and the swRising signal 116 when the sampleDead signal 230 is high and otherwise determines the relative delay (i.e., compares the present delay to a stored past delay). Suffice it to say here that the deadLonger signal 226 indicates when the present delay is longer than the past delay and the deadShorter signal 228 indicates when the present delay is shorter than the past delay.

The LSgate signal 56 is coupled to an inverter 705 and to a delay line 700 including a plurality of delay cells 704a-704y configured to provide a plurality of delay signals 728 to unit cells 702a-702y. In order to ensure reliable detection, the adjustable delay element 212 and the delay comparator 214 are designed using similar delay cells so that shifts due to process, temperature, or bias conditions will tend to cancel. Thus, the delay comparator 214 has a resolution on the order of the least significant bit (LSB) weight of the adjustable delay element 212 (FIG. 7). If the comparison is less than one LSB of the adjustable delay element 212, then the delay comparator 214 will cause both the deadLonger signal 226 and the deadShorter signal 228 to be low, thereby indicating that there has been no change in the delay (i.e., the past delay is substantially the same as the present delay). As an example, each delay cell 704a-704y may have a delay of about one-half the LSB delay step of the adjustable delay element 212 (FIG. 7). With this arrangement, the delay comparator 214 is able to reject small deviations in the delay comparison that are not attributable to the LSB delay step of the adjustable delay element 212.

It will be appreciated that the delay cells 704a-704y can establish the same or different delays as each other. Using different magnitudes of delays can allow the delay comparator 214 to measure a wider range of delays than otherwise possible, since the total sum of the delay established by the delay line 700 corresponds to the maximum delay that the delay comparator 214 can measure. In one example, a first plurality of the delay cells 704a-704y can provide a first predetermined delay and a second plurality of the delay cells can provide a second predetermined delay that is shorter than the first predetermined delay. With this type of configuration, coarser steps can be used to get an approximate measurement of the delay and then finer delay steps can be used to "tune" the measurement to the actual delay with high resolution.

Each unit cell 702a-702y includes a first register 714, as may be implemented with a latch, to store the present delay and provide a present delay signal 726 and a second register 716, as also may be implemented with a latch, to store the past delay and provide a past delay signal 728. The present delay register 714 is strobed every period that the switch node 11 is active (i.e. during the slew time interval) by a strbDead signal 730. The strbDead signal 730 is generated in response to the LSgate signal 56, thereby latching the register on the rising edge of swRising signal 116, and the swRising signal 116 and in one example, corresponds to the dead time when neither transistor is on. The duration of the strbDead signal 730 defines the interval during which the present delay between the LSgate signal 56 and the swRising signal 116 is measured and stored.

The sampleDead signal 230 (FIG. 7) is buffered by a buffer 708 to provide a strbReg signal 732 that enables the past register 716 to transfer the present delay from the present delay register 714 to the past delay register 716. This transfer may occur when the strbDead signal 730 is low (i.e., when the present delay register 714 is disabled).

Logic gates 718 and 720 are coupled to receive the present delay signal 726 and the past delay signal 728, as shown. The output signals 734 from gates 718 of the plurality of unit cells 702a-702y are coupled through further gates 722, 710 to generate the deadShorter signal 228 for coupling to the dead time calibration state machine 244 (FIG. 7). Similarly, the output signals 736 from the gates 720 from the plurality of unit cells 702a-702y are coupled through further gates 724, 712 to generate the deadLonger signal 226 for coupling to the dead time calibration state machine 244 (FIG. 7).

In the example embodiment, for the deadShorter signal 228 or for the deadLonger signal 226 to be at a logic high level, at least two consecutive unit cells 702a-702y must have a mismatch between the past delay signal 728 and the present delay signal 726. More particularly, when the present delay signal 726 is low and the past delay signal 728 is high, then the output signal 734 will be at a logic high, and if two consecutive outputs 734 are high, logic gate 722 will pass a logic high signal through OR gate 710 forcing the deadShorter signal 228 to be at a logic high level. Similarly, when the present delay signal 726 is high and the past delay signal 728 is low, then the output signal 736 will be at a logic high, and if two consecutive outputs 736 are high, logic gate 724 will pass a logic high signal through OR gate 712 forcing the deadLonger signal 226 to be at a logic high level.

It will be appreciated that other techniques can be used to implement the delay comparator 214. However, the described digital approach may reject process variations and mismatches better than some other techniques, such as analog techniques.

Referring also to FIG. 10, a flow diagram illustrates a technique 400 implemented by the dead time calibrator 240 of FIG. 7. The rectangular elements (typified by element 402) are herein denoted "processing blocks" and the diamond-shaped elements (typified by element 404) are herein denoted "decision blocks" and either or both may represent computer software instructions or groups of instructions. It should be noted that the flow diagram of FIG. 10 (and other flow diagrams herein) represent exemplary embodiments of designs disclosed herein and variations in such embodiments, which generally follow the processes outlined, are considered to be within the scope of the concepts, systems and techniques described and claimed herein. Some or all of the blocks may represent operations performed by functionally equivalent circuits. Also, some blocks may be manually performed while other blocks may be performed by machine. The flow diagrams do not depict the syntax of any particular programming language. Rather, the flow diagrams illustrate the information one of ordinary skill in the art requires to fabricate circuits and/or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence described is illustrative only and in instances can be varied without departing from the spirit of the concepts described and/or claimed herein. Thus, unless otherwise stated, the processes described below are unordered meaning that, when possible, the actions shown in the diagrams can be performed in any convenient or desirable order, including simultaneously.

The dead time is initially set to a maximum value in block 401 by the resetDead signal 224. Thus, the dead register 216 may be set to a value corresponding to a minimum delay by delay element 212 in order to achieve a maximum dead time target, since for a delay coupled to the low side switch 14, an attempt to decrement the dead time is equivalent to increasing the delay provided by delay element 212. Thereafter, a dead time decrementing phase 440 is entered during which it is attempted to decrement the dead time at block 402, following which the relative delay between the switch node voltage SW 11 and the LSgate signal 56 is determined at decision block 404. Before the dead time is attempted to be decremented (and herein, before each time that the dead time is attempted to be decremented or incremented as also occurs at blocks 408, 414, and 420), the relative delay (difference between the present delay and past delay) is captured by transferring the present delay from the present delay register 714 to the past delay register 716 (FIG. 9) in response to strbReg signal 732 (FIG. 9) as indicated by the "sampleDead" statement in blocks 402, 408, 414, 420, and 421.

If it is determined at decision block 404 that the present delay is longer than the past delay (e.g., as may be indicated by the deadLonger signal 226), then the dead time is again attempted to be decremented at block 402. Similarly, if it is determined that the present delay is shorter than the past delay (e.g., as may be indicated by the deadShorter signal 228), then the dead time is again attempted to be decremented at block 402 following a wait period at block 406. The present delay being shorter than the past delay indicates that the dead time is positive. The wait period block 406 may be on the order of sixty switching cycles (set by the bandwidth of the regulation loop) to ensure that the calibration routine does not respond to transients. In the unlikely event that a line or load transient occurs and the delay comparison at block 404 indicates an erroneous longer present dead time than past dead time, then an attempt will be made immediately to decrement the dead time at block 402 to ensure that proper operation is maintained. It will be appreciated that the delay compare block 404 and wait block 406 alternatively could be implemented by averaging the delay comparison over several cycles and proceeding to attempt to decrement the dead time if a majority of the cycles yields a shorter relative delay.

If it is determined at block 404 that the delay has not changed (i.e., the present delay is substantially equal to the past delay as indicated by both the deadLonger signal 226 and the deadShorter signal 228 being low for example), then a dead time tuning and validation phase 442 is entered. More particularly, validation is performed at decision block 418 to validate that an optimal dead time has been achieved. No change in the relative delay following the dead time decrement block 402 indicates that the dead time has crossed from being a positive dead time to a negative dead time. Once the dead time is negative, further attempts to decrement the dead time will not cause a change in the result of the delay comparator 214 (FIG. 7), since the low side switch 14 solely determines when the switch node SW 11 is released. Any further attempts to decrement the dead time at this point will increase the shoot through current and the switch node slew rate, due to overcharging the high side gate voltage HSgate 316 as shown in FIG. 8. Given the significant shoot through current, the delay element 212 (FIG. 7) is immediately decremented (i.e., the incDead signal 220 is incremented in block 414 without a wait state) in order to impact the efficiency as little as possible.

The dead time corresponding to the point at or very near to when the dead time crosses from being positive to negative can be considered an optimal dead time. Before validating the dead time at block 418, the dead time may be incremented at block 414 as may be desirable to back off slightly from the dead time setting at which a positive dead time just becomes a negative dead time in order to minimize the efficiency loss associated with a negative dead time. Following a wait state 416, it is determined at validation decision block 418 whether the relative delay is still unchanged. The wait state 416 causes the validation 418 to be performed over many cycles, such as on the order of 60 cycles, to ensure that transients do not affect the determination.

If it is determined in decision block 418 that the relative delay has changed, then the optimal dead time has not been found. More particularly, if the present delay is determined to be longer than the past delay (430), then the calibrator returns to block 402 to again attempt to decrement the dead time. Alternatively, if the present delay is determined to be shorter than the past delay (428), then the calibrator attempts to increase the dead time (and additionally captures the relative delay) at block 408 and again determines at decision block 411 whether the relative delay has changed. If it is determined that the present delay is longer than the past delay, it is again attempted to decrement the dead time at block 402. If however it is determined that the present delay is either shorter than the past delay or that there has been no change in the delay even following the increment in block 408 due to a negative dead time, then the dead time is again incremented at block 408. This additional comparison block 411 ensures that a positive dead time is achieved so that the decrementing phase 440 can find the optimal dead time.

If it is determined in validation block 418 that the relative delay has not changed, then the validation has passed (432). In this case, a further increment of the dead time may be made in block 420 in order to further increase the efficiency, following which a dead time calibration termination phase 446 may be entered. More particularly, the relative delay is captured in block 421 by the sampleDead signal 230 going high so that subsequent changes in the dead time can be detected.

Thereafter, the system idles at block 412 and continuously checks the relative delay at decision block 410 in order to determine whether a change in the system operating conditions results in the optimal dead time changing. A determination at decision block 410 that the present delay is shorter than the past delay (434) can indicate that the threshold voltage of the switches 12, 14 has changed resulting in a more negative dead time. Accordingly, the dead time is attempted to be incremented at block 408 until the present dead time becomes longer than the past dead time. If it is determined at decision block 410 that the present delay is longer than the past delay, then the dead time has become more positive due to changing operating conditions and the decrementing phase 440 recommences, as shown.

The dead time calibration method 400 presumes that the switch node 11 is switching and that the regulator operating conditions have not dramatically changed. In order to ensure proper operation, a resetCal signal 234 and a holdCal signal 232 are provided to the state machine (FIG. 7), as may be from an external control unit or processor. The resetCal signal 234 is forced high during system events that significantly change the operating point of the switch node SW 11, such as start up of the regulator or fault events. When the resetCal signal 234 is high, the state machine 244 is forced into and held at an initial state 401 which also forces the resetDead signal 224 high to reset the dead register 216 to the initial, most positive dead time setting. For less significant events, or simply when operation of the switch node SW 11 is held off for a brief period of time, the holdCal signal 232 is used. When the holdCal signal 232 is high, the contents of the dead register 216 remain unchanged and the state machine 244 is held at a wait or comparison state (e.g., states 404, 406, 416, 418, 411, 421, 412, or 410). Once the holdCal signal 232 goes low, the process 400 resumes.

It will be appreciated that while the dead time calibrator 240 is described as adjusting only the delay between the high side control signal HSON 52 and the low side control signal LSgate 56, in some embodiments, it may be desirable to additionally or alternatively control a delay associated with driving the high side switch 12. As one example, the above circuitry and techniques can additionally include a further delay element between the HSON signal 52 and the gate terminal of the high side switch 12 with which the high side control signal HSgate 316 can be delayed relative to the low side control signal LSgate 56 under certain operating conditions, such as when the delay element 212 sets the maximum initial dead time (i.e., corresponding to a minimum delay) or during a predetermined range of dead times including the maximum initial dead time.

Referring also to FIG. 11, a switching regulator 500 that implements a quick start calibration in addition to dead time calibration includes control circuit 48, regulator circuitry 90, a driver circuit 504, dead time control and calibration circuit, or calibrator 240, and a quick start control and calibration circuit, or simply control circuit, or calibrator.

The driver circuit 504 includes a quick start driver 512 that is responsive to the HSON signal 52 and generates a high side control signal HSgate 508 for coupling to the gate terminal of the high side switch 12. The driver 512 is further responsive to a quick start adjustment adjQstart signal 522 from the quick start control circuit 510 and provides a quickStart signal 520 to the quick start control circuit 510, as shown. The quickStart signal 520 may be the same as or similar to the quick start signal 108 (FIG. 3). Thus, the quick start signal 520 establishes an initial driver interval (referred to herein alternatively as the quick start interval) during which the switch 12 is quickly charged to at or near its Miller plateau, without overshoot. The quickStart signal 520 can be provided in the form of a pulse that commences in response to a transition of the low side control signal LSgate 56 and ends when the switch node voltage SW 11 starts to rise. In this way, the end of the quick start signal, or pulse can be considered to provide an indicator of the start of the slew time interval. It will be appreciated that an optimal quick start interval will vary based on the threshold voltage and the gate capacitance of the high side switch 12. Because of this variation, the calibrator 510 includes circuitry and implements techniques to tailor the quick start interval to the switch parameters.

Quick start calibrator 510 includes a state machine 514, a quick start comparator 516, and a Qstart register 518. The quick start comparator 516 monitors the quickStart signal 520 and the state machine 514 adjusts the quickStart signal via the adjQstart signal 522 under certain conditions. In an embodiment, the quick start comparator 516 is configured to determine if a dead time (i.e., a time when neither the high side switch 12 nor the low side switch 14 is on) resulting from the quickStart signal 520 is greater than an upper limit related to a maximum dead time target. The quick start comparator 516 may additionally or alternatively monitor the quickStart signal 520 to determine if the quick start pulse terminates after a lower limit related to the high side switch 12 turning on (i.e., when the switch node voltage 11 begins to rise).

An example quick start comparator 516 is shown in FIG. 13. Suffice it to say here that the comparator 516 generates a deadLongError signal 530 that provides an indication of whether the dead time exceeds the upper limit and a deadShortError signal 532 that provides an indication of whether the quickStart signal pulse terminates after the lower limit. In one example, both the deadLongError signal 530 and the deadShortError signal 532 are low if the dead time is less than the upper limit and the quick start pulse terminates before the lower limit, the deadLongError signal 530 is high and the deadShortError signal 532 is low if the dead time is greater than the upper limit, and the deadLongError signal 530 is low and the deadShortError signal 532 is high if the quickStart pulse terminates after lower limit.

The state machine 514 performs a quick start calibration routine to generate an incQstart signal 524, a decQstart signal 526, and a resetQstart signal 528, all of which are coupled to the Qstart register 518. The Qstart register 518 generates the adjQstart signal 522 with an up/down counter in response to the incQstart signal 524, the decQstart signal 526, and/or the resetQstart signal 528 to control a delay in the driver 512. In one example embodiment, the address bus 522 has a width of 5 bits and results in a ISB weight of 0.3 ns to 3 ns, for example. An example driver 512 is shown in FIG. 14 and described below.

Referring also to FIG. 12, example signal waveforms associated with the regulator 500 of FIG. 11 include the switch node voltage 11, the high side switch drain to source current Ids 314, the high side control signal HSgate 508, the low side control signal LSgate 56, and the quickStart signal 520. Each of the illustrated signals is shown in connection with various operating conditions. A first portion 574 of the waveforms illustrates the respective signals when the regulator 500 is operating with several different quick start intervals decreasing from left to right, a second portion 576 of the waveforms illustrates the signals when the regulator 500 is operating with a first quick start interval, and a third portion 578 of the waveforms illustrates the signals when the regulator 500 is operating with a second, optimal quick start interval, and a fourth portion 580 of the waveforms illustrates the signals when the regulator 500 is operating with a third quick start interval.

Consideration of the waveforms illustrates that as the quick start interval increases, the gate to source voltage 508 reaches the Miller plateau 588 in less time and the switch node voltage SW 11 rises earlier. Waveform portion 576 illustrates an operating point when the quick start interval is considered too short, as can result in a dead time that is greater than a maximum dead time target (i.e., greater than an upper limit) necessary to achieve a relatively short switch on time target. This condition is flagged by the deadLongError signal 530 (FIG. 11). Waveform portion 578 illustrates an optimal quick start interval as is apparent by the quick start interval stopping just before the Miller plateau 592 is reached, thereby allowing a higher impedance gate drive to control the switch node as shown in FIG. 14. The last portion 580 of the waveforms illustrates that when the quick start interval is too long, as can result when the quick start interval terminates after the switch node voltage SW 11 begins to rise (i.e., when the quick start pulse terminates after the lower limit), the gate to source voltage HSgate 508 can overshoot, resulting in a fast switch node rise time. This condition is flagged by the deadShortError signal 532 (FIG. 11).

Referring also to FIG. 13, an example quick start comparator 516 includes a first delay element 554 that is responsive to an inverted version of the LSgate signal 56 provided by an inverter 550 to generate an input signal for a latch 558. The delay element 554 sets an upper limit for the regulator dead time and may be selected based on the minimum on time of the SW node 11, such as on the order of 10 ns for a 75 ns minimum on time. More particularly, the delay established by delay element 554 may be selected to provide a relatively small permissible margin beyond a predetermined maximum dead time target.

A second delay element 560 responsive to the quickStart signal 520 sets a lower limit for the quick start interval and provides an input signal to a latch 570. The delay established by delay element 560 may be selected to provide a relatively small permissible margin beyond high side switch turning on (i.e., when the switch node voltage SW 11 begins to rise), but during which the quick start pulse still may be active. Therefore, delay element 560 accounts for the inherent delay associated with translating the control signals on the low side to the output (i.e., to the gate terminal 112 of the high side switch) on the high side.

Latches 558 and 570 are enabled (i.e., strobed) from a time when the low side switch 14 turns off to a time when the switch node voltage SW 11 begins to rise thereby latching the state on the swRising signal 116 rising edge, as is achieved in response to the strbDead signal 568 from a logic gate 564. The output of latch 558 is the deadLongError signal 530 that is indicative of the dead time being greater than the upper limit. The output of latch 570 is the deadShortError signal 532 that is indicative of the quickStart signal 520 being asserted outside of the strobe period (i.e., the quick start interval ending after the lower limit when the switch node voltage begins to rise).

Referring also to FIG. 14, an example quick start driver circuit 512 includes a driver control signal generator 640 and driver stage circuitry 644. The driver stage circuitry 644 includes a plurality of driver stages 660a-660b, each having a control input responsive to a respective driver control signal 662a-662b generated by the driver control signal generator 640 and an output coupled to the output of the other ones of the plurality of driver stages and to the control terminal (i.e., the gate terminal) of the high side switch 12 (FIG. 11). In the illustrated embodiment, each driver stage 660a-660b includes a driver transistor, such as in the form of the illustrated PMOS FETs, having a control input provided by its gate terminal and an output provided by its drain terminal. The driver transistors 660a, 660b are coupled in parallel with their source terminals coupled together and their drain terminals coupled together, as shown.

Each driver control signal 662a-662b has an on time during which the respective driver transistor is on and an off time during which the respective driver transistor is off. At least one of the driver control signals 662a-662b has an on time that is controlled by the quickStart signal 520 and at least another one of the driver control signals has an on time controlled by a combination of the quickStart signal 520 and the HSON signal 52. With this arrangement, during the quick start interval (i.e., when the quickStart signal 520 is active), both of the driver stages 660, 660b are on; whereas, after the quick start interval, only one of the driver stages 660a, 660b is on. When more than one driver stage is turned on (during the quick start interval), the total impedance of the parallel driver stages is decreased as compared to when only one driver stage is on, in order to thereby allow the gate 112 of the high side switch 12 to charge more quickly than otherwise possible. Thus, in the illustrated embodiment, both of the driver stages 660a, 660b are on during the quick start interval and thereafter, only one of the driver stages, 660b is on during the slew time interval of the switch 12 (as the switch node voltage SW 11 rises).

The driver control signal generator 640 includes an adjustable delay element 650 to generate the quickStart signal 520 in response to the HSON signal 52 and the adjQstart signal 522. A logic gate 652 receives the HSON signal 52 and an output signal from the adjustable delay element 650 and generates the quickStart signal 520. Logic gate 654a receives the HSON signal 52 and logic gates 654a-654b receive the quickStart signal 520, as shown.

Level shifters 664a-664b are coupled between respective outputs of OR gates 654a-654b and the driver stage circuitry 644 in order to translate the logic level signals associated with the OR gates 654a-654b to high side signal levels for coupling to the driver stage circuitry 644. As noted above in connection with other driver circuits, the driver control signal generator 640 could alternatively be implemented on the high side, thereby reducing the number of required level shifters 664a-664b.

In addition to the plurality of driver stages 660a-660b, the driver stage circuitry 644 includes pre-driver buffer stages 678a-678b, 680a-680b. The buffer stages are sized to achieve a predetermined gate drive level for the driver stages 660a-660b and each buffer stage may have the same or different drive capability. It will be appreciated that additional or fewer pre-driver buffer stages may be provided. Here, the buffers 678a-678b and 680a-680b are provided in the form of inverters.

One of the level shifted signals, here a signal from level shifter 664a that corresponds to the delayed signal 662a that controls the first driver stage 660a, is coupled to a buffer inverter 672 for further coupling to a buffer inverter 674 and to a gate terminal of an NMOS FET 670. The NMOS FET 670 has a drain terminal coupled to the gate terminal of the high side switch 12 (FIG. 11) and a source terminal coupled to the switch node SW 11 (FIG. 11). In operation, the NMOS transistor 670 is off when any of the PMOS driver transistors 660a-660b is on.

Referring also to FIG. 15, a flow diagram illustrates a technique 600 implemented by the quick start calibrator 510 of FIG. 11. At block 601, the Qstart register 518 is reset in response to the resetQstart signal 528. It is then determined at block 602, such as by comparator 516 (FIG. 11), whether a dead time when neither the high side switch 12 nor the low side switch 14 is on that occurs in response to the quickStart signal 520 is greater than an upper limit related to a maximum dead time target and whether the quick start signal pulse terminates after a lower limit related to the high side switch turning on. If neither of these conditions is true (i.e., if both the dead time is less than the upper limit and the quick start pulse terminates before the lower limit), then the quick start signal is considered to be within an acceptable range and the calibration routine proceeds to a wait state 604 in order to ensure that the result from decision block 602 was not due to a transient. Illustrative wait intervals implemented by wait block 604 may be on the order of 60 PWM cycles. The function of comparison by the quick start comparator 516 in block 602 and the wait state 604 could alternatively be implemented by averaging the comparison over several cycles and proceeding forward with the comparison result that has the highest average.

After wait state 604, the state machine 514 (FIG. 11) then rechecks the quickStart signal pulse width again to determine if it is within the comparison window (i.e., if the dead time is less than the upper limit and the quick start pulse terminates before the lower limit) with decision block 610. If it is determined at decision block 610 that the quick start signal 520 within the comparison window (632), then the quick start calibration is terminated at block 614. If it is determined at decision block 610 that the dead time is greater than the upper limit (as may be indicated by the deadLongError signal 530), then the quick start interval is incremented at block 606 and processing continues as described above. If on the other hand, it is determined at decision block 610 that the quick start pulse terminates after the lower limit (as may be indicated by signal deadShortError signal 532), then the quick start interval is decremented at block 608 and processing continues as described above.

If in block 602 it is determined that the dead time is greater than the upper maximum dead time target (622), the Qstart register 518 is incremented by the incQstart signal 524 at block 606. Once the quick start signal 522 is incremented, it is determined at block 612 whether the Qstart register 516 is at the upper limit. If the Qstart register 516 is not at the upper limit (0), then a wait block 611 is entered, following which the process repeats beginning with block 602. In this way, the quickStart signal pulse width is repeatedly incremented for as long as the Qstart register 516 is not at the upper limit. If alternatively, it is determined at block 612 that the Qstart register 516 is at the upper limit (1), then the quick start calibration is deemed completed at block 614 because no further quick start can be applied.

Thereafter, the quick start signal is again monitored at block 620. If in block 620, the quick start pulse is determined to terminate after the lower limit (634), then the process returns to block 608 to decrement the pulse width. If alternatively it is determined at block 620 that the dead time is greater than the upper limit or that the both the dead time is less than the upper limit and the quick start pulse terminates before the lower limit (636), then the calibration routine is completed at block 614.

If in block 602 it is determined that quick start pulse terminates after the lower limit when the high side switch turns on, then the Qstart register 518 is decremented by the decQstart signal 526 at block 608. Once the quick start signal 522 is decremented, it is determined at block 616 whether the Qstart register 518 is at its lower limit. If the quick start register 518 is at its lower limit (1), then the quick start calibration is completed without further rechecking at block 618. If the deadShortErrror persists even after the Qstart register 518 is at its lower limit, then the calibration is "permanently" completed in block 618. This scenario can occur, for example, in the presence of a negative load current which can cause the switch node voltage SW 11 to rise immediately after the low side switch 14 is turned off. If however the Qstart register 518 is not at its lower limit (0), then the quick start calibration is deemed completed at block 614, following which the quick start pulse termination is again rechecked at block 620. In this way, the quick start calibration includes decrementing the quickStart signal pulse width in response to an active deadShortError signal (624) since this signal indicates that the end of the quick start interval is too close to the Miller plateau and could result in the switch node voltage SW 11 rising too fast. If the deadShortErrror persists even after the Qstart register 518 is at its lower limit, as done after decision block 602, then the calibration is "permanently" completed in block 618.

A QcalDone signal 536 and a recalQstart signal 538 (FIG. 11) may be coupled between the quick start calibration state machine 514 and the dead time calibration state machine 244 (in embodiments including both calibrations). The quick start calibration routine 600 must complete before the dead time calibration routine 400 (FIG. 10) starts. This is because the quick start calibration will significantly alter the dead time possibly making it impractical to run the dead time calibration routine at the same time as the quick start calibration routine. In addition, to make the quick start calibration as effective as possible, the calibration must be performed with the most positive dead time, which is when the dead register 216 (FIG. 11) is held in reset. Since the quick start calibration must be completed before the dead time calibration routine begins, the QcalDone signal 536 may be used to initiate the start of the dead time calibration routine. At any of the blocks where the quick start calibration is deemed completed (blocks 614, 618), the QcalDone signal 536 is asserted. In addition, if the dead time calibration routine cannot complete (e.g., because the dead time is at its limit in state 402), the quick start calibration routine 600 is signaled to restarted with the recalQstart signal 538.

The quick start calibration (like the dead time calibration described above) requires that the switch node 11 be switching and that the regulator operating conditions not dramatically change. In order to ensure proper operation, the resetCal signal 234 and the holdCal signal 232 are provided to the quick start state machine 514 (FIG. 11), as may be from an external control unit or processor. Here again, the resetCal signal 234 is forced high during system events that significantly change the operating point of the switch node SW 11, such as start up of the regulator or fault events. When the resetCal signal 234 is high, the state machine 514 is forced into and held at an initial state 601 which also forces the resetDead signal 224 high to reset the Qstart register 518. For less significant events, or simply when operation of the switch node SW 11 is held off for a brief period of time, the holdCal signal 232 is used. When the holdCal signal 232 is high, the contents of the Qstart register 518 remain unchanged and the state machine 514 is held at a wait or comparison state (e.g., states 602, 610, 620, 604, and 611). Once the holdCal signal 232 goes low, the process 600 resumes.

It will be appreciated that while the quick start signal 522 is described as controlling the duration of the quick start period, this signal may alternatively or additionally be used to control the drive impendence. For this implementation, the quick start period would be a fixed duration, 10 ns for example, and the adjQstart signal 552 would control the drive strength used during the fixed quick start period. The adjustable drive strength may be implemented with multiple drivers using a variety of on/off combinations to generate a variety of drive strengths.

It will be appreciated that while the quick start signal 520 is described in connection with FIG. 11 as only controlling a single switch (high side switch 12), the optimized quick start signal can also be used to drive other switches in the system. Referring also to FIG. 16, an H-Bridge buck boost regulator 700 implementing quick start calibration and a dead time calibration includes control circuit 48, regulator circuitry 702, an input driver circuit 504a, an output driver circuit 504b, a dead time and quick start calibration circuit 704a to control the input driver circuit 504a and a dead time and quick start calibration circuit 704b to control the output driver circuit 504b. The H-bridge regulator circuitry 702 includes an input high side switch 12a, an input low side switch 14a, an output high side switch 12b, and an output low side switch 14b, coupled to inductor 16 as shown to generate a regulated output voltage Vout 18.

The dead time and quick start calibration circuit 704a can be the same as or similar to a combination of dead time calibrator 240 and quick start calibrator 510 (FIG. 11). The output driver 504b differs from driver 504a in that a delay element 212b (that may be the same as or similar to delay element 212 of FIG. 11) is coupled to the gate of high side output switch 12b through buffer 44b and the quick start driver circuit 512b (that may be the same as or similar to quick start driver circuit 512 of FIG. 11) is coupled to the gate of the low side output switch 14b. The dead time and quick start calibration circuit 704b can thus, be the same as or similar to a combination of dead time calibrator 240 and quick start calibrator 510 of FIG. 11, but is configured to control delay element 212b coupled to the high side output switch 12b and to control quick start driver 512b coupled to the low side output switch 14b, as shown. Thus, whereas the dead time calibrator 240 (FIG. 11) is configured to calibrate the dead time between the low side switch 14 turning off and the high side switch 12 turning on, the calibrator 704b is configured to calibrate the dead time between the high side switch 12b turning off and the low side switch 14b turning on. Accordingly, the calibration circuit 704a may be configured to monitor the delay between the low side switch 14a turning off and the voltage at the switch node SWa rising in order to determine when to stop changing the dead time adjustment; whereas the calibration circuit 704b may be configured to monitor the delay between the high side switch 12b turning off and the voltage at the switch node SWb falling in order to determine when to stop changing the dead time adjustment.

It will be appreciated that various alternatives may be implemented. For example, the quick start calibration implemented by circuits 704a, 704b may be combined in the sense that only one such circuit (circuit 704a for example) may generate the adjQstart signal (signal 522a for example) and that same adjQstart signal 522a may be coupled to both the quick start driver 512a and also to the quick start driver 512b. The optimized quick start signal 522a for example may also be used to drive the high side switch of a secondary high side switch (not shown) in the same system regulating a second load. Also, or alternatively, the dead time calibration implemented by circuits 704a, 704b can be combined in the sense that only one such circuit (circuit 504a for example) may generate the adjDead signal (signal 218a for example) and that same adjDead signal 218a may be coupled to both the delay element 212a and also to the delay element 212b.

All references cited herein are hereby incorporated herein by reference in their entirety.

Having described preferred embodiments, it will now become apparent to one of ordinary skill in the art that other embodiments incorporating their concepts may be used.

It will be appreciated that the proposed circuitry and techniques can be applied to any linear or switching regulator topology including but not limited to Buck, Boost, Buck-Boost, SEPIC, Cúk, half-bridge, full bridge, and linear regulators utilizing with any type of control loop including current mode control, voltage mode control, constant on time control, constant off time control, or any other analog and/or digital control scheme. In addition, the proposed circuitry and techniques can be applied to regulators that regulate current, voltage, power, or other parameters. The circuitry and techniques described herein can be implemented using hardware, software, and/or firmware in a digital and/or analog fashion. Thus, it will be appreciated that certain terms used herein, such as controller, processor, control circuit, state machine, can be implemented in any suitable fashion and are not intended to require any particular implementation methodology.

It is felt therefore that these embodiments should not be limited to disclosed embodiments, but rather should be limited only by the spirit and scope of the appended claims.

What is claimed is:

1. A driver circuit for driving a switching transistor having a control terminal responsive to a switching control signal, comprising:
a plurality of driver stages, each having a control input responsive to a respective driver control signal having an on time during which the driver stage is on and an off time during which the driver stage is off and having an output coupled to the output of the other ones of the plurality of driver stages and to the control terminal of the switching transistor, wherein at least one of the plurality of driver control signals has an on time that is delayed with respect to an on time of another one of the plurality of driver control signals, wherein the switching transistor has a slew time interval that commences when a Miller plateau of the switching transistor is reached and terminates when a source to drain voltage of the switching transistor reaches a final voltage level and wherein at least two of the driver stages are on during the slew time interval; and
a driver control signal generator configured to generate the plurality of driver control signals, wherein each of the driver control signals is responsive to a slew time interval indication signal indicative of commencement of the slew time interval.

2. The driver circuit of claim 1 wherein each of the plurality of driver stages comprises a driver transistor having a gate terminal providing the control input, a source terminal, and a drain terminal, wherein the source terminals of each of the driver transistors are coupled together and the drain terminals of each of the driver transistors are coupled together and to the control terminal of the switching transistor.

3. The driver circuit of claim 2 wherein the driver control signal generator comprises at least one delay element.

4. The driver circuit of claim 3 wherein the driver control signal generator is responsive to the slew time interval indication signal to cause each of the plurality of driver stages to turn on and off substantially simultaneously for an initial interval.

5. The driver circuit of claim 4 wherein the initial interval is selected to charge the input capacitance of the driver transistors to a Miller plateau.

6. The driver circuit of claim 4 wherein the driver control signal generator is responsive to the slew time interval indication signal to gate the at least one delay element.

7. The driver circuit of claim 3 further comprising a level shifter coupled between the driver control signal generator and the control input of the plurality of driver stages.

8. The driver circuit of claim 3 further comprising a buffer coupled between the driver control signal generator and the control input of the plurality of driver stages.

9. The driver circuit of claim 2 wherein at least two of the plurality of driver transistors have substantially the same impedance.

10. The driver circuit of claim 2 wherein at least two of the plurality of driver transistors have different impedances.

11. The driver circuit of claim 1 wherein the switching transistor operates in a synchronous Buck converter.

12. The driver circuit of claim 11 wherein the switching transistor is a high side switching transistor of a synchronous Buck converter.

13. The driver circuit of claim 1 wherein the switching transistor operates in an H-bridge Buck Boost converter having an input driver circuit with a high side input switch and a low side input switch and an output driver circuit with a high side output switch and a low side output switch and wherein the switching transistor is one or both of the high side input switch or the low side output switch.

14. A method of controlling a switching transistor of a converter comprising:
providing a plurality of driver stages, each having a respective control input and an output coupled to the output of other ones of the plurality of driver stages and to the switching transistor, wherein the switching transistor has a slew time interval that commences when a Miller plateau of the switching transistor is reached and terminates when a source to drain voltage of the switching transistor reaches a final voltage level;
generating a plurality of driver control signals for coupling to the plurality of driver control inputs in response to a slew time interval indication signal indicative of commencement of the slew time interval,
delaying turning on at least one of the plurality of driver stages relative to at least one other one of the plurality of driver stages, and
turning on at least two of the driver stages during the slew time interval.

15. The method of claim 14 wherein providing a plurality of driver stages comprises:
providing a plurality of driver transistors, each having a gate terminal providing the control input, a source terminal, and a drain terminal; and
coupling the drain terminal of the plurality of driver transistors together and to the switching transistor.

16. The method of claim 14 wherein delaying turning on at least one of the driver stages comprises using a delay element to generate at least one of the driver control signals.

17. The method of claim 16 further comprising turning on and off each of the plurality of driver stages substantially simultaneously for an initial interval in response to the slew time interval indication signal.

18. The method of claim 17 further comprising selecting the initial interval based on a Miller plateau.

19. The method of claim 18 further comprising gating the delay element with the slew time interval indication signal.

20. The method of claim 16 further comprising shifting the level of the plurality of driver control signals.

21. The method of claim 16 further comprising buffering the plurality of driver control signals.

* * * * *